(12) United States Patent
Lin

(10) Patent No.: US 12,205,934 B2
(45) Date of Patent: Jan. 21, 2025

(54) ELECTRONIC COMPONENT PACKAGE AND MANUFACURING METHOD THEREOF

(71) Applicant: Diodes Incorporated, Plano, TX (US)

(72) Inventor: Shiau-Shi Lin, Taoyuan (TW)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 18/787,689

(22) Filed: Jul. 29, 2024

(65) Prior Publication Data

US 2024/0387485 A1 Nov. 21, 2024

Related U.S. Application Data

(63) Continuation of application No. PCT/CN2023/112139, filed on Aug. 10, 2023.

(30) Foreign Application Priority Data

Aug. 24, 2022 (CN) .......................... 202211020943.1

(51) Int. Cl.
*H01L 25/10* (2006.01)
*H01L 23/00* (2006.01)
(Continued)

(52) U.S. Cl.
CPC ........ *H01L 25/105* (2013.01); *H01L 23/3107* (2013.01); *H01L 23/49517* (2013.01);
(Continued)

(58) Field of Classification Search
None
See application file for complete search history.

(56) References Cited

U.S. PATENT DOCUMENTS 6,218,695 B1 * 4/2001 Nachumovsky ... G11C 16/0475
257/314
2016/0315188 A1 * 10/2016 Disney ................ H01L 29/0692
(Continued)

FOREIGN PATENT DOCUMENTS

DE 102023104975 A1 * 10/2023 ....... H01L 21/76895
TW 201813107 A 4/2018
(Continued)

OTHER PUBLICATIONS

Office Action and Search Report from Taiwan Patent Application No. 111142891, dated Jul. 10, 2023, 5 pages.

*Primary Examiner* — Michael Lebentritt
(74) *Attorney, Agent, or Firm* — Kilpatrick Townsend & Stockton LLP

(57) ABSTRACT

The present invention relates to an electronic component package and a manufacturing method therefor. In an embodiment, the electronic component package comprises: a first metal layer, a high-voltage transistor semiconductor die, a first molding compound layer, a second metal layer, a first vertical connection structure, a second vertical connection structure, a control circuit bare chip, and a second molding compound layer. In the electronic component package of the present invention, a lead frame and electrical leads are replaced with the metal layers and the vertical connection structures, so that the position of the electrical connection of the chip is more flexible and the heat dissipation effect is better. Compared with the lead frames and the electrical leads, the electronic component package of the present disclosure is more suitable for packaging high-voltage or high-current chips.

20 Claims, 23 Drawing Sheets

(51) Int. Cl.
*H01L 23/31* (2006.01)
*H01L 23/495* (2006.01)
*H01L 25/00* (2006.01)

(52) U.S. Cl.
CPC ........ *H01L 23/49537* (2013.01); *H01L 24/19* (2013.01); *H01L 24/24* (2013.01); *H01L 25/50* (2013.01); *H01L 24/16* (2013.01); *H01L 2224/16145* (2013.01); *H01L 2224/19* (2013.01); *H01L 2224/24146* (2013.01); *H01L 2225/1041* (2013.01)

(56) References Cited

U.S. PATENT DOCUMENTS

| | | |
|---|---|---|
| 2020/0058580 A1* | 2/2020 | Lin ................ H01L 23/5228 |
| 2020/0176349 A1 | 6/2020 | Hsu et al. |
| 2020/0343218 A1 | 10/2020 | Hu et al. |
| 2021/0343547 A1 | 11/2021 | Chang et al. |
| 2022/0230930 A1 | 7/2022 | Grassmann |

FOREIGN PATENT DOCUMENTS

| | | | |
|---|---|---|---|
| TW | 201919175 A | 5/2019 |
| TW | 202002188 A | 1/2020 |
| TW | 202123403 A | 6/2021 |
| TW | 202226509 A | 7/2022 |
| TW | 202230682 A | 8/2022 |

* cited by examiner

ELECTRONIC COMPONENT PACKAGE AND MANUFACURING METHOD THEREOF

CROSS-REFERENCES TO RELATED APPLICATIONS

This application is a continuation of International patent application No. PCT/CN2023/112139, filed Aug. 10, 2023, entitled "ELECTRONIC COMPONENT PACKAGE AND MANUFACTURING METHOD THEREOF", which claims priority to Chinese patent application No. 202211020943.1, filed on Aug. 24, 2022, entitled "ELECTRONIC COMPONENT PACKAGE AND MANUFACTURING METHOD THEREOF," the disclosures of which are hereby incorporated by reference in their entirety.

TECHNICAL FIELD

The present invention relates to an electronic component package and a manufacturing method therefor, and more specifically, to an electronic component package having a high-voltage transistor semiconductor die and a control circuit bare chip.

BACKGROUND OF THE INVENTION

In electronic component (e.g., chip or integrated circuit (IC)) packages, lead frame packaging technology may be used to provide electrical connections of chip endpoints through electrical leads (wires). As the packaging technology continues to increase in density and miniaturization, the number of input/output (I/O) connection pins of the package and the interconnection therein will increase and become more complex. Since the lead frame can only provide a layer of wiring, so that the location of the chip electrical connection is limited, this spatial limitation becomes a technical bottleneck for multi-chip packaging. Moreover, the heat dissipation problem may also become severe to affect the performance of the chip.

Flip-chip packaging technology may also realize multi-chip packaging, but chips are connected to each other through a package substrate in a face-down manner. Compared with the use of a lead frame, the manufacturing cost of the flip-chip packaging technology may be increased, and its throughput may also be reduced due to a more complicated manufacturing process.

SUMMARY OF THE INVENTION

Embodiments of the present disclosure are directed to an electronic component package. The electronic component package comprises: a first metal layer comprising a first external terminal, a second external terminal, and a third external terminal that are not in direct contact with each other; a high-voltage transistor semiconductor die having a gate, a source, and a drain, wherein the drain is located on a side of the high-voltage transistor semiconductor die, the gate and the source is located on the opposite side of the high-voltage transistor semiconductor die, the high-voltage transistor semiconductor die is disposed on the first metal layer, and the drain is coupled to the second external terminal; a first molding compound layer having a first side and a second side that are opposite to each other, the first molding compound layer covering the high-voltage transistor semiconductor die, the first molding compound layer further covering at least a portion of the first metal layer, wherein the first external terminal, the second external terminal, and the third external terminal are exposed from the first side of the first molding layer; a second metal layer comprising a first metal layer portion and a second metal layer portion that are not in direct contact with each other, wherein the second metal layer is disposed on the second side of the first molding compound layer; a first vertical connection structure passing through the first molding compound layer and coupling the first metal layer portion to the first external terminal; a second vertical connection structure passing through a portion of the first molding compound layer and coupling the second metal layer portion to the gate of the high-voltage transistor semiconductor die; a control circuit bare chip having an active surface facing the gate and the source of the high-voltage transistor semiconductor die, the active surface comprising a first control terminal and a second control terminal that are correspondingly coupled to the first metal layer portion and the second metal layer portion; and a second molding compound layer having a first side and a second side that are opposite to each other, wherein the second molding compound layer is disposed on the first molding compound layer, and the first side of the second molding compound layer is attached to the second side of the first molding compound layer, so that the second molding compound layer covers the control circuit bare chip and the second metal layer; wherein the first control terminal of the control circuit die chip is coupled to the first external terminal through the first metal layer portion and the first vertical connection structure; wherein the second control terminal of the control circuit die chip is coupled to the gate of the high-voltage transistor semiconductor die through the second metal layer portion and the second vertical connection structure; and wherein the source of the high-voltage transistor semiconductor die is coupled to the third external terminal.

In some embodiments, the first side of the first conductive via contacts the first external terminal. In some embodiments, the first side of the first conductive via is coplanar with the first side of the second conductive via. In some embodiments, the first side of the fourth conductive via contacts the third external terminal. In some embodiments, the first side of the fourth conductive via is coplanar with the first side of the third conductive via. In some embodiments, the monolithic conductor is covered by the first molding compound layer. In some embodiments, the electronic component package further includes: a first solder ball disposed on the first metal layer portion and coupling a metal layer on the first control terminal of the control circuit bare chip to the first metal layer portion; and a second solder ball disposed on the second metal layer portion and coupling a metal layer on the second control terminal of the control circuit bare chip to the second metal layer portion. In some embodiments, the second molding compound layer covers the first solder ball and the second solder ball.

Embodiments of the present disclosure are directed to a method for manufacturing an electronic component package. The method comprises: providing a temporary carrier; forming a first metal layer on the temporary carrier, the first metal layer comprising a first external terminal, a second external terminal, and a third external terminal that are not in direct contact with each other; disposing a high-voltage transistor semiconductor die on the first metal layer, wherein the high-voltage transistor semiconductor die has a gate, a source, and a drain, and wherein the drain is located on a side of the high-voltage transistor semiconductor die and coupled to the second external terminal, and the gate and the source are located on the opposite side of the high-voltage transistor semiconductor die; forming a first molding compound layer on the temporary carrier to cover the high-voltage transistor semiconductor die and at least a portion of the first metal layer, wherein the first molding compound layer has a first side and a second side that are opposite to each other; forming a second metal layer on the second side of the first molding compound layer, the second metal layer comprising a first metal layer portion and a second metal layer portion that are not in direct contact with each other; coupling the first metal layer portion to the first external terminal; coupling the second metal layer portion to the gate of the high-voltage transistor semiconductor die; disposing a control circuit bare chip on the first molding compound, the control circuit bare chip having an active surface facing the gate and the source of the high-voltage transistor semiconductor die, the active surface comprising a first control terminal and a second control terminal that are correspondingly coupled to the first metal layer portion and the second metal layer portion; forming a second molding compound layer on the first molding compound layer, the second molding compound layer having a first side and a second side that are opposite to each other, and the first side of the second molding compound layer being attached to the second side of the first molding compound layer to cover the control circuit bare chip and the second metal layer; coupling the source of the high-voltage transistor semiconductor die to the third external terminal; and removing the temporary carrier to expose the first external terminal, the second external terminal, and the third external terminal from the first side of the first molding compound layer.

BRIEF DESCRIPTION OF THE DRAWINGS

When the following detailed description is read with reference to the accompanying drawings, aspects of several embodiments of the present disclosure may be best understood. It should be noted that various structures may not be drawn to scale. Indeed, for clarity of discussion, the dimensions of the various structures can be arbitrarily enlarged or reduced.

Figure 1A:
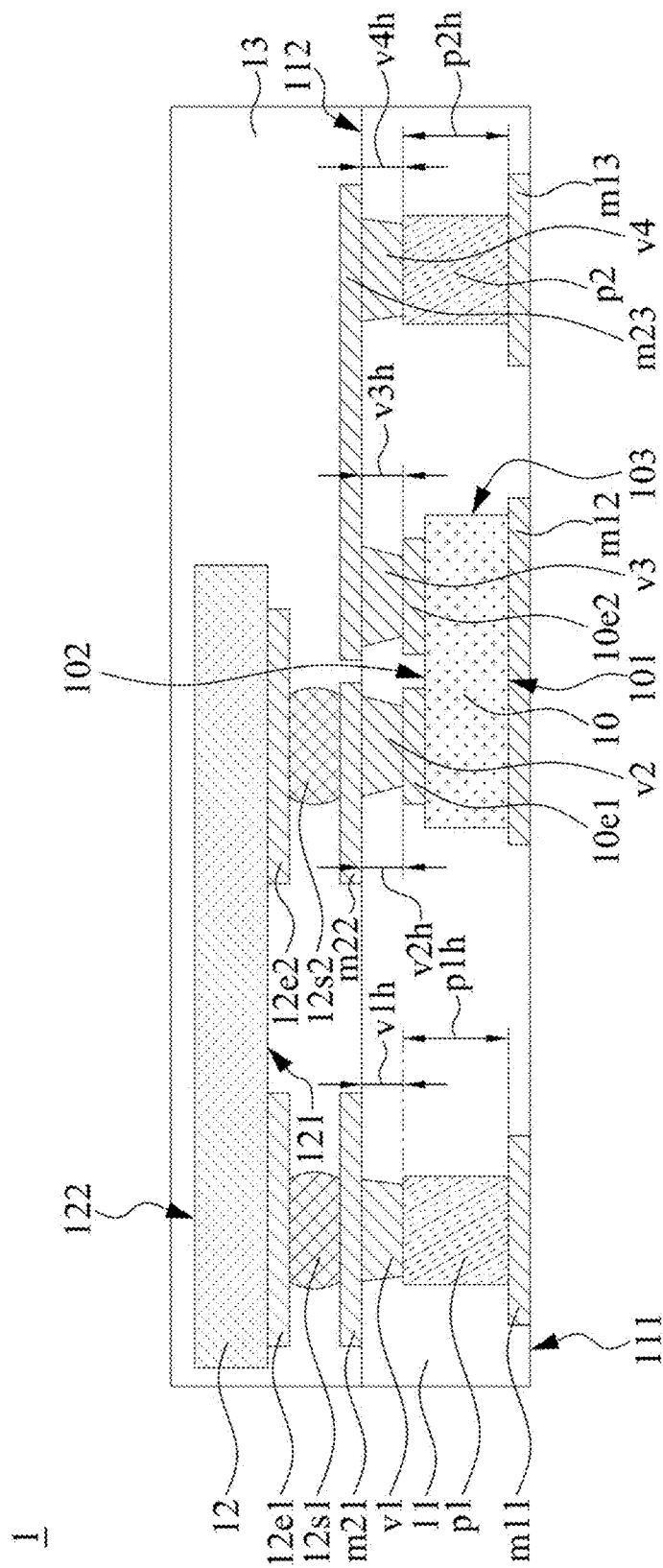
FIG. 1A shows a cross-sectional view of an electronic component package according to certain embodiments of the present application.

The same or similar components are denoted with the same reference signs in the drawings and detailed description. Several embodiments of the present disclosure will be immediately understood from the following detailed description with reference to the accompanying drawings.

DETAILED DESCRIPTION OF SPECIFIC EMBODIMENTS

The following disclosure provides numerous different embodiments or examples for implementing different features of the presented subject matter. Specific examples of components and configurations will be described below. Of course, these are merely examples and are not intended to be limiting. In the present disclosure, the reference to forming a first feature above or on a second feature may include an embodiment in which the first feature and the second feature are formed in direct contact, and may further include an embodiment in which another feature may be formed between the first feature and the second feature such that the first feature and the second feature may not be in direct contact. Moreover, reference numerals and/or letters may be repeated in various examples of the present disclosure. This repetition is for simplicity and clarity and itself does not indicate the relationship between various embodiments and/or configurations discussed.

The embodiments of the present disclosure will be discussed in detail below. However, it should be understood that the present disclosure provides a number of applicable concepts that can be embodied in a wide variety of particular environments. The specific embodiments discussed are merely illustrative and do not limit the scope of the present disclosure.

The present disclosure provides an electronic component package and a manufacturing method therefor. The electronic component package of the present disclosure integrates a high-voltage transistor semiconductor die and a control circuit bare chip in one packaging body, and may meet the need for miniaturization and reduce the circuit wiring area on a printed circuit board (PCB) or template. In addition, in the electronic component package of the present disclosure, a lead frame and electrical leads are replaced with a metal layer (e.g., a redistribution layer (RDL) and a vertical connection structure (e.g., a conductive pillar or a conductive via). Compared with the lead frame and electrical leads, the electronic component package of the present disclosure is more suitable for packaging high-voltage or high-current chips. Still further, because active surfaces (or active regions) of the chip of the present disclosure can be connected face-to-face through the metal layer, the communication path between the chips can be shortened, and the communication rate may be increased.

With reference to FIG. 1A, FIG. 1A shows a cross-sectional view of an electronic component package 1 according to certain embodiments of the present application. The electronic component package 1 may include electronic components 10 and 12, encapsulants 11 and 13, a first metal layer (including external terminals m11, m12 and m13) and a second metal layer (including metal layer portions m21, m22 and m23).

The external terminals m11, m12, and m13 of the first metal layer may not be in direct contact with each other. For example, the external terminals m11, m12, and m13 may be separated from each other through the encapsulate 11. For example, the external terminals m11, m12, and m13 may not be directly connected to each other. The external terminal m12 may be located between the external terminals m11 and m13.

The size (e.g., width, thickness, area, etc.) of the external terminals m11, m12, and m13 may be the same as or different from each other. As shown in FIG. 1A, the width of the external terminal m12 may be greater than the width of the external terminal m11 or m13. In some embodiments, the area of the external terminal m12 may be about 1 to 2 times the area (e.g., surface area) of the electronic component 10. Further, as shown in FIG. 1A, the thickness of the external terminals m11, m12, and m13 may be the same as each other. The external terminals m11, m12, and m13 may each include a conductive material such as metal or metal alloy. Examples of the conductive material may include gold (Au), silver (Ag), copper (Cu), platinum (Pt), palladium (Pd), other metals or alloys, or combinations of two or more thereof. The external terminals m11, m12, and m13 may provide an electrical connection between the electronic component package 1 and an external device (e.g., a PCB, another package, or another electronic component).

The electronic component 10 may include a semiconductor chip (or die). The chip may include circuit components such as transistors, resistors, capacitors, and interconnection structures to form an integrated circuit (IC). In some embodiments, the electronic component 10 may include a Metal-Oxide-Semiconductor Field-Effect Transistor (MOSFET), for example, (but not limited to) an NMOS, a PMOS, a CMOS, a voltage feedback device and/or a switch.

In some embodiments, the electronic component 10 may include a high-voltage transistor having a higher breakdown voltage (or withstand voltage), and may be applied to a circuit with a high input voltage and/or a high output voltage. Further, the electronic component 10 may include any type of integrated circuit, such as a memory device including a dynamic random access memory (DRAM), a static random access memory (SRAM)) and various types of non-volatile memory (including a programmable read-only memory (PROM) and a flash memory); an optoelectronic device; a logic device; and a communication device, and other types of devices.

The electronic component 10 may have a surface 101, a surface 102 opposite to the surface 101, and a surface (or a side surface) 103 extending between the surface 101 and the surface 102. One or more electrical terminals may be exposed from the surface 101 and/or surface 102 of the electronic component 10. For example, a gate and source of the electronic component 10 may be located on the same side of the electronic component 10, and a drain may be located on the opposite side. The drain of the electronic component 10 may be located at the surface 101, and the gate and source may be located at the surface 102.

The electronic component 10 may be located on the first metal layer. The drain of the electronic component 10 may be coupled (or electrically connected) to the external terminal m12 of the first metal layer. The drain of the electronic component 10 may contact the external terminal m12 of the first metal layer. A drain metal layer (i.e., the external terminal m12) of the drain may be located at the surface 101, and a gate metal layer 10e1 of the gate and a source metal layer 10e2 of the source may be located at the surface 102.

The encapsulate 11 may cover the electronic component 10 and at least a part of the first metal layer. The encapsulate 11 may include a molding compound (e.g., an epoxy molding compound) or other suitable materials including, but not limited to, epoxy resins, phenolic resins, silicon-containing resins, etc., or combinations thereof.

The encapsulate 11 may have a surface 111 and a surface 112 opposite to the surface 111. The external terminals m11, m12, and m13 of the first metal layer may be exposed from the surface 111. In some embodiments, the external terminals m11, m12, and m13 of the first metal layer may each be flush with or coplanar with the surface 111.

Metal layer portions m21, m22, and m23 of the second metal layer may be located at the surface 112 of the encapsulate 11. In other words, the first metal layer and the second metal layer are located on opposite sides of the encapsulate 11. The first metal layer may be partially buried in the encapsulate 11, and the second metal layer may protrude from the surface 112 of the encapsulate 11.

The metal layer portions m21, m22, and m23 of the second metal layer may not be in direct contact with each other. For example, the metal layer portions m21, m22, and m23 may be separated from each other through the encapsulate 13. For example, the metal layer portions m21, m22, and m23 may not be directly connected to each other. The metal layer portion m22 may be located between the metal layer portions m21 and m23.

The size (e.g., width, thickness, area, etc.) of the metal layer portions m21, m22, and m23 may be the same as or different from each other. As shown in FIG. 1A, the width of the metal layer portion m23 may be greater than the width of the metal layer portion m21 or the metal layer portion m22. Further, as shown in FIG. 1A, the thickness of the metal layer portions m21, m22, and m23 may be the same as each other. The metal layer portions m21, m22, and m23 may each include a conductive material such as metal or metal alloy. Examples of the conductive material may include gold (Au), silver (Ag), copper (Cu), platinum (Pt), palladium (Pd), other metals or alloys, or combinations of two or more thereof.

The second metal layer may be encapsulated between the encapsulates 11 and 13. The second metal layer may be a portion of an internal interconnection structure of the electronic component package 1. The second metal layer may include a redistribution layer. The second metal layer may provide an electrical connection between the electronic components 10 and 12, provide an electrical connection between the electronic component 10 and the first metal layer, and provide an electrical connection between the electronic component 12 and the first metal layer.

In some embodiments, the metal layer portion m21 may provide an electrical connection between the electronic component 12 and the external terminal m11. For example, the metal layer portion m21 may be coupled to the external terminal m11 through a vertical connection structure passing through at least a part of the encapsulate 11. As shown in FIG. 1A, the vertical connection structure may include a conductive via v1 and a conductive pillar p1. The conductive pillar p1 may be disposed between the external terminal m11 and the conductive via v1. The conductive pillar p1 may extend from one side (e.g., a bottom thereof) of the conductive via v1 to the surface 111 of the encapsulate 11 to contact the external terminal m11. The conductive pillar p1 may include a first side (e.g., a bottom thereof) contacting the external terminal m11 and a second side (e.g., a top portion thereof) contacting the conductive via v1. The diameter of the conductive pillar p1 may remain unchanged from the second side to the first side. For example, the top diameter of the conductive pillar p1 is equal to the bottom diameter thereof. The conductive via v1 may be disposed between the conductive pillar p1 and the metal layer portion m21. The conductive via v1 may include a first side (e.g., a bottom thereof) in contact with the conductive pillar p1 and a second side (e.g., a top portion thereof) in contact with the metal layer portion m21. The diameter of the conductive via v1 may be reduced from the second side to the first side. For example, the diameter of the conductive via v1 on a side close to the metal layer portion m21 is greater than that on a side close to the conductive pillar p1. For example, the top diameter of the conductive via v1 is greater than the bottom diameter thereof. The conductive via v1 may extend from the surface 112 of the encapsulate 11 to the surface 111. The first side (e.g., the bottom thereof) of the conductive via v1 may be coplanar with the surface 111, and the second side (e.g., the top thereof) of the conductive via v1 may be coplanar with the surface 112.

In some embodiments, the metal layer portion m22 may provide an electrical connection between the electronic components 10 and 12. For example, the metal layer portion m22 may be coupled to the gate metal layer 10e1 of the gate of the electronic component 10 through a vertical connection structure passing through at least a part of the encapsulate 11. As shown in FIG. 1A, the vertical connection structure may include a conductive via v2. The conductive via v2 may be disposed between the gate metal layer 10e1 and the metal layer portion m22. The conductive via v2 may include a first side (e.g., a bottom thereof) in contact with the gate metal layer 10e1 and a second side (e.g., a top portion thereof) in contact with the metal layer portion m22. The diameter of the conductive via v2 may be reduced from the second side to the first side. For example, the diameter of the conductive via v2 on a side close to the metal layer portion m22 is greater than that on a side close to the gate metal layer 10e1. For example, the top diameter of the conductive via v2 is greater than the bottom diameter thereof. The conductive via v2 may extend from the surface 112 of the encapsulate 11 to the surface 111. The first side (e.g., the bottom thereof) of the conductive via v2 may not be coplanar with the surface 111, and the second side of the conductive via v2 (e.g., the top thereof) may be coplanar with the surface 112.

In some embodiments, the metal layer portion m23 may provide an electrical connection between the electronic component 10 and the external terminal m13. For example, the metal layer portion m23 may be coupled to the source metal layer 10e2 of the source of the electronic component 10 through a vertical connection structure passing through at least a part of the encapsulate 11. As shown in FIG. 1A, the vertical connection structure may include a conductive via v3. The conductive via v3 may be disposed between the source metal layer 10e2 and the metal layer portion m23. The conductive via v3 may include a first side (e.g., a bottom thereof) in contact with the source metal layer 10e2 and a second side (e.g., a top portion thereof) in contact with the metal layer portion m23. The diameter of the conductive via v3 may be reduced from the second side to the first side. For example, the diameter of the conductive via v3 on a side close to the metal layer portion m23 is greater than that on a side close to the source metal layer 10e2. For example, the top diameter of the conductive via v3 is greater than the bottom diameter thereof. The conductive via v3 may extend from the surface 112 of the encapsulate 11 to the surface 111. The first side (e.g., the bottom thereof) of the conductive via v3 may be coplanar with the surface 111, and the second side (e.g., the top thereof) of the conductive via v3 may be coplanar with the surface 112.

In some embodiments, the metal layer portion m23 may be coupled to the external terminal m13 through a vertical connection structure passing through at least a part of the encapsulate 11. As shown in FIG. 1A, the vertical connection structure may include a conductive via v4 and a conductive pillar p2. The conductive pillar p2 may be disposed between the external terminal m13 and the conductive via v4. The conductive pillar p2 may extend from a side (e.g., the bottom thereof) of the conductive via v4 to the surface 111 of the encapsulate 11 to contact the external terminal m13. The conductive pillar p2 may include a first side (e.g., a bottom thereof) contacting the external terminal m13 and a second side (e.g., a top portion thereof) contacting the conduction via v4. The diameter of the conductive pillar p2 may remain unchanged from the second side to the first side. For example, the top diameter of the conductive pillar p2 is equal to the bottom diameter thereof. The conductive via v4 may be disposed between the conductive pillar p2 and the metal layer portion m23. The conductive via v4 may include a first side (e.g., a bottom thereof) in contact with the conductive pillar p2 and a second side (e.g., a top portion thereof) in contact with the metal layer portion m23. The diameter of the conductive via v4 may be reduced from the second side to the first side. For example, the diameter of the conductive via v4 on a side close to the metal layer portion m23 is greater than that on a side close to the conductive pillar p2. For example, the top diameter of the conductive via v4 is greater than the bottom diameter thereof. The conductive via v4 may extend from the surface 112 of the encapsulate 11 to the surface 111. The first side (e.g., the bottom thereof) of the conductive via v4 may be coplanar with the surface 111, and the second side (e.g., the top thereof) of the conductive via v4 may be coplanar with the surface 112.

In some embodiments, the height p1h of the conductive pillar p1 and the height p2h of the conductive pillar p2 may be equal. The first side (e.g., the bottom thereof) of the conductive pillar p1 that contacts the external terminal m11 may be coplanar with the first side (e.g., the bottom thereof) of the conductive pillar p2 that contacts the external terminal m13. The second side (e.g., the top thereof) of the conductive pillar p1 that contacts the conductive via v1 may be coplanar with the second side (e.g., the top thereof) of the conductive pillar p2 that contacts the conductive via v4. In some embodiments, the second side (e.g., the top thereof) of the conductive pillar p1 that contacts the conductive via v1 may be coplanar with a surface of the gate metal layer 10e1 (or the source metal layer 10e2). In some embodiments, the second side (e.g., the top thereof) of the conductive pillar p2 that contacts the conductive via v4 may be coplanar with a surface of the gate metal layer 10e1 (or the source metal layer 10e2).

In some embodiments, the height v1h of the conductive via v1, the height v2h of the conductive via v2, the height v3h of the conductive via v3, and the height v4h of the conductive via v4 may be equal. The first side (e.g., the bottom thereof) of the conductive via v1 in contact with the conductive pillar p1, the first side (e.g., the bottom thereof) of the conductive via v2 in contact with the gate metal layer 10e1, the first side (e.g., the bottom thereof) of the conductive via v3 in contact with the source metal layer 10e2, and the first side (e.g., the bottom thereof) of the conductive via v4 in contact with the conductive pillar p2 may be coplanar. The second side (e.g., the top thereof) of the conductive via v1 in contact with the metal layer portion m21, the second side (e.g., the top thereof) of the conductive via v2 in contact with the metal layer portion m22, the second side (e.g., the top thereof) of the conductive via v3 in contact with the metal layer portion m23, and the second side (e.g., the top thereof) of the conductive via v4 in contact with the metal layer portion m23 may be coplanar.

The electronic component 12 may be located on the surface 112 of the encapsulate 11. The electronic component 12 may be located on the second metal layer. The electronic component 12 may include a semiconductor chip (or die). The chip may include circuit components such as transistors, resistors, capacitors, and interconnection structures to form an integrated circuit (IC). In some embodiments, the electronic component 12 may include a control circuit. Further, the electronic component 12 may include any type of control circuit, such as a central processing unit (CPU), a graphics processing unit (GPU), a microprocessor unit (micro processing unit, MPU), an Application-specific integrated circuit (ASIC), a field-programmable gate or grid array (FPGA), a microcontroller, a system-on-chip (SoC), etc. The electronic component 12 may be coupled to the electronic component 10 to control the electronic component 10.

The electronic component 12 may have a surface 121 and a surface 122 opposite to the surface 121. The surface 121 may include an active surface, and the surface 122 may include a passive surface or a backside surface. The surface 121 of the electronic component 12 may face the surface 102 of the electronic component 10. The surface 121 of the electronic component 12 may face the gate and source of the electronic component 10. One or more control terminals (or electrical terminals) may be exposed from the surface 121 of the electronic component 12. For example, metal layers 12e1 and 12e2 of the control terminals (or the electrical terminals) may be located at the surface 121.

The metal layer 12e1 may be coupled to the metal layer portion m21 of the second metal layer through an electrical connector 12s1, and then to the external terminal m11. The metal layer 12e2 may be coupled to the metal layer portion m22 of the second metal layer through the electrical connector 12s2, and then to the gate metal layer 10e1 of the gate of the electronic component 10.

In some embodiments, the electrical connectors 12s1 and 12s2 may each include solder balls, such as controllable collapse chip connection bump (C4) bumps, ball grid arrays (BGA) or land grid arrays (LGA).

The encapsulate 13 may cover the electronic component 12, the electrical connectors 12s1 and 12s2, and at least a part of the second metal layer. The encapsulate 13 may be attached to the surface 112 of the encapsulate 11. In some embodiments, the encapsulate 13 may include a material such as those listed for the encapsulate 11. In some embodiments, there may be an interface between the encapsulate 13 and the encapsulate 11. In other embodiments, however, there may be no interface between the encapsulate 13 and the encapsulate 11.

Figure 1B:
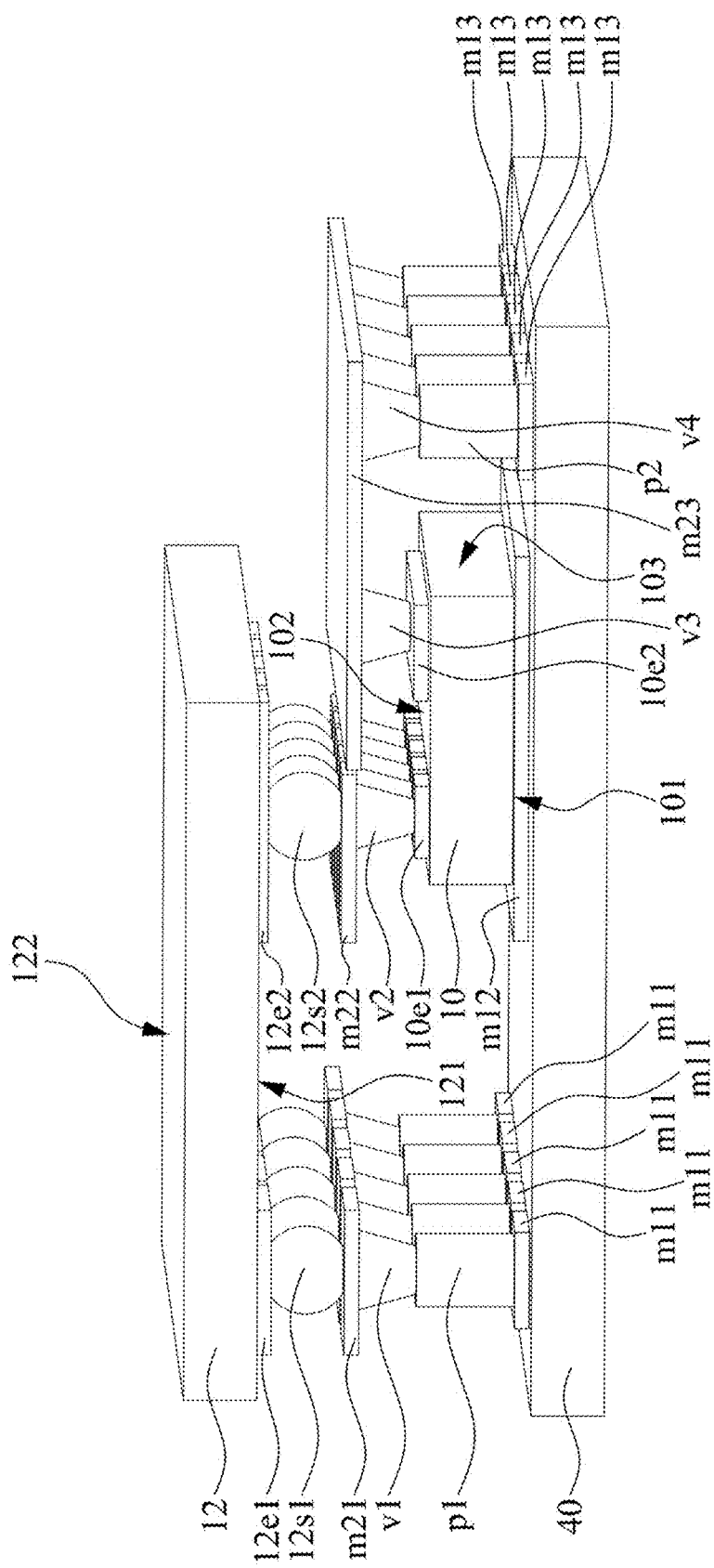
FIG. 1B shows a perspective view of an electronic component package according to certain embodiments of the present application.

FIG. 1B shows a perspective view of an electronic component package according to certain embodiments of the present application. In some embodiments, the electronic component package shown in FIG. 1B may have a cross-sectional view as shown in FIG. 1A. The encapsulants 11 and 13 are omitted in FIG. 1B for the sake of brevity. Elements of the electronic component package shown in FIG. 1B that are the same as or similar to those of the electronic component package 1 shown in FIG. 1A are denoted with the same reference signs, and the detailed description of the same or similar components will not be repeated.

An electronic component package shown in FIG. 1B is placed on a temporary carrier 40. The temporary carrier 40 may include a substrate, such as a ceramic substrate, a semiconductor substrate, a dielectric substrate, a glass substrate, or the like. The temporary carrier 40 may be conductive, for example, including a metal substrate or having a metal layer or a conductive layer thereon. The first metal layer is disposed on the temporary carrier 40.

The first metal layer may include a plurality of external terminals m11 and a plurality of external terminals m13. The plurality of external terminals m11 may be arranged along a side surface of the electronic component 10. Although five external terminals m11 are depicted in FIG. 1B, the number of external terminals m11 is not limited thereto. In some embodiments, depending on design requirements, there may be any number of external terminals m11. For example, the number of external terminals m11 may correspond to the number of control terminals on the surface 121 of the electronic component 12. For example, a plurality of electrical connector 12s1, a plurality of metal layer portions m21, and a plurality of vertical connection structures (each including a conductive via v1 and a conductive pillar p1) may be disposed on the corresponding external terminals m11 to couple the corresponding control terminals to the corresponding external terminals m11.

The plurality of external terminals m13 may be arranged along another side surface (e.g., the surface 103) of the electronic component 10. Although five external terminals m13 are depicted in FIG. 1B, the number of external terminals m13 is not limited thereto, and may be different from the number of external terminals m11. In some embodiments, depending on design requirements, there may be any number of external terminals m13. For example, when the current of the source of the electronic component 10 is larger, the external terminals m13 and the vertical connection structures (each including the conductive via v4 and the conductive pillar p2) above them may be more, so as to provide more current paths and improve heat dissipation efficiency.

Figure 2:
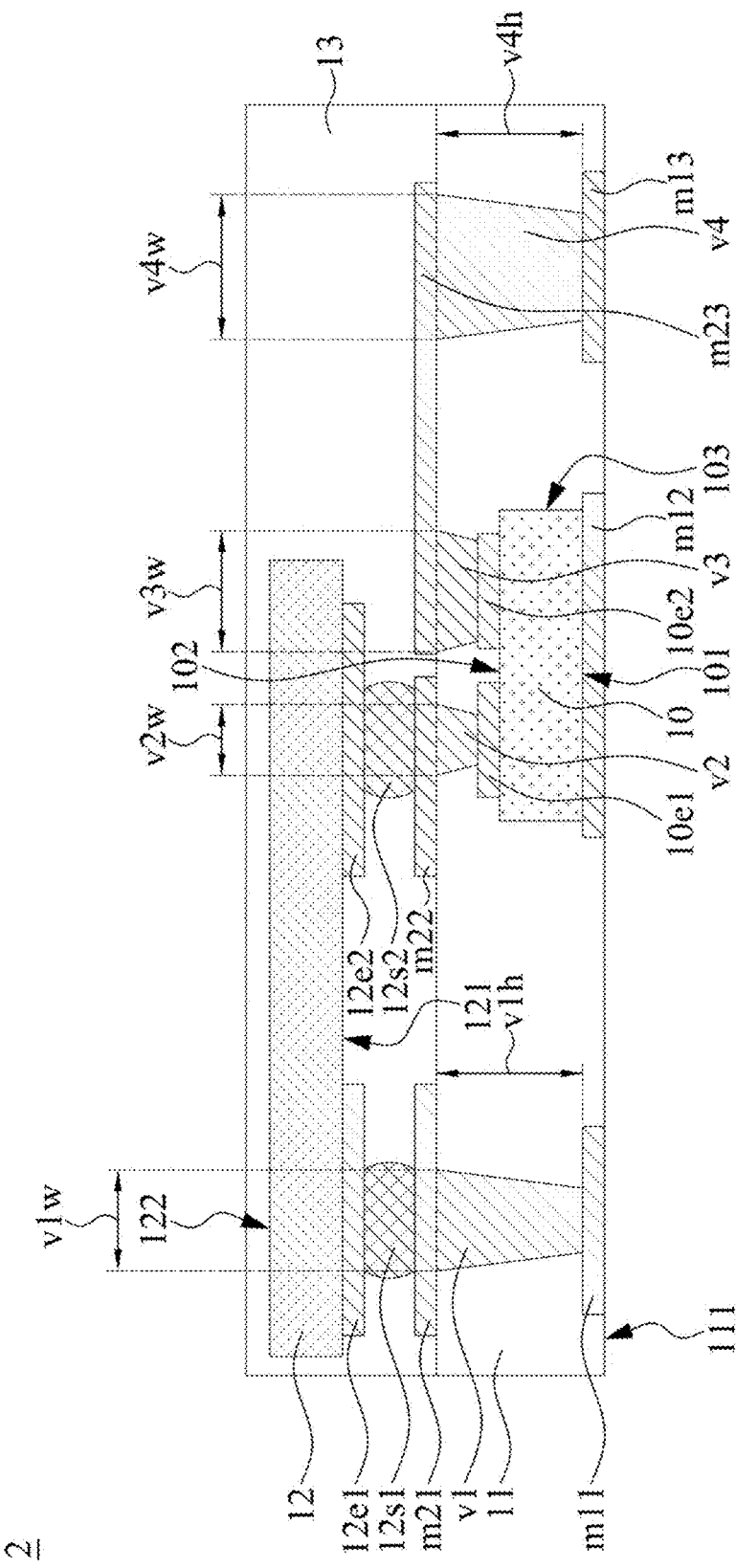
FIG. 2 shows a cross-sectional view of an electronic component package according to certain embodiments of the present application.

In some embodiments, the conductive pillars p1 and p2 may be omitted, and the conductive via v1 may be directly coupled to the external terminal m11 and the conductive via v4 may be directly coupled to the external terminal m13, as shown in FIG. 2. However, using the conductive pillar plus the conductive via as the vertical connection structure on the external terminal m11 and the external terminal m13 may improve the electrical conductivity compared with only using the conductive via.

The first metal layer may include a single layer of external terminal m12, which is located on the surface 101 of the electronic component 10 to contact the drain. Therefore, in the present disclosure, the external terminal m12 may also be referred to as a drain metal layer of the electronic component 10. As described previously, the area of the external terminal m12 may be about 1 to 2 times the area (e.g., surface area) of the electronic component 10. The plurality of external terminals m11 and the plurality of external terminals m13 may be located at opposite sides of the external terminal m12, respectively.

The electronic component 10 may include a plurality of gates and a plurality of gate metal layers 10e1. In some embodiments, the electronic component 10 may include a single source and a single source metal layer 10e2. However, the number of gates or sources of the electronic component 10 is not limited thereto. For example, the number of gates of the electronic component 10 may correspond to the number of control terminals on the surface 121 of the electronic component 12. For example, a plurality of electrical connector 12s2, a plurality of metal layer portions m22, and a plurality of conductive vias v2 may be disposed on the corresponding gate metal layers 10e1 to couple the corresponding control terminals to the corresponding gates.

The second metal layer may include a plurality of metal layer portions m21 and a plurality of metal layer portions m22. As described previously, the number of metal layer portions m21 and m22 may correspond to the number of control terminals on the surface 121 of the electronic component 12. The metal layer portions m21 may each be located between one electrical connector 12s1 and a conductive via v1. The metal layer portions m22 may each be located between one electrical connector 12s2 and one conductive via v2.

The second metal layer may include a single layer of metal layer portion m23. The metal layer portion m23 may couple the source of the electronic component 10 to a plurality of external terminals m13. However, the number of metal layer portions m23 is not limited thereto. For example, when the electronic component 10 includes a plurality of sources, the sources may be coupled to the corresponding external terminals m13 through the plurality of metal layer portions m23.

Figure 1C:
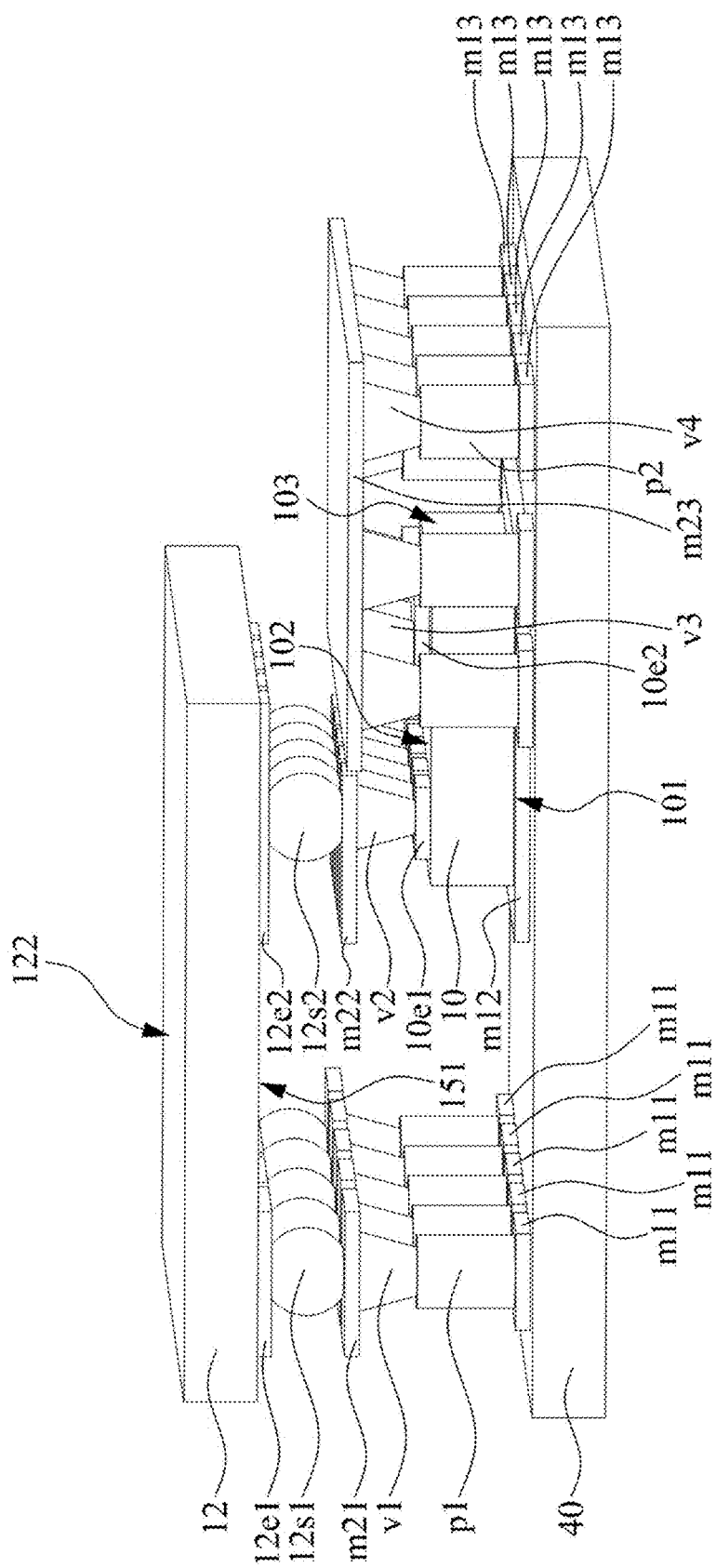
FIG. 1C shows a perspective view of an electronic component package according to certain embodiments of the present application.

FIG. 1C shows a perspective view of an electronic component package according to certain embodiments of the present application. In some embodiments, the electronic component package shown in FIG. 1C may have a cross-sectional view as shown in FIG. 1A. The encapsulants 11 and 13 are omitted in FIG. 1C for the sake of brevity. The electronic component package shown in FIG. 1C is similar to the electronic component package shown in FIG. 1B, and the differences therebetween will be described below.

The plurality of external terminals m13 and the vertical connecting structures (each including a conductive via v4 and a conductive pillar p2) above them may be arranged along three side surfaces of the electronic component 10. For example, the plurality of external terminals m13 and the vertical connection structures above them may surround three side surfaces of the electronic component 10. The metal layer portions m23 may cover the electronic component 10 and extend beyond three side surfaces of the electronic component 10. As described previously, when the current of the source of the electronic component 10 is larger, the external terminals m13 and the vertical connection structures above them may be more, so as to provide more current paths and improve heat dissipation efficiency.

FIG. 2 shows a cross-sectional view of an electronic component package 2 according to certain embodiments of the present application. The electronic component package 2 shown in FIG. 2 is similar to the electronic component package 1 shown in FIG. 1A, and the same or similar components are denoted with the same signs. A detailed description of the same or similar components will not be repeated, and the differences therebetween will be described below.

In the electronic component package 2, the conductive pillar p1 and p2 are omitted, and the conductive via v1 is directly coupled to (or in contact with) the external terminal m11, and the conductive via v4 is directly coupled to (or in contact with) the external terminal m13. The height v1h of the conductive via v1 and the height v4h of the conductive via v4 may be equal. The height v1h of the conductive via v1 and the height v4h of the conductive via v4 may each be greater than the height v2h of the conductive via v2 or the height v3h of the conductive via v3.

In some embodiments, the width (e.g., maximum width) v2w of the conductive via v2 may be less than any one of the width v1w of the conductive via v1, the width v3w of the conductive via v3, and the width v4w of the conductive via v4. The width v2w of the conductive via v2 may range from about 50 to 200 microns (μm). In some embodiments, the width (e.g., maximum width) v4w of the conductive via v4 may be greater than any one of the width v1w of the conductive via v1, the width v2w of the conductive via v2, and the width v3w of the conductive via v3.

In some embodiments, since the conductive pillars p1 and p2 are omitted, there may be fewer process steps of the electronic component package 2. Moreover, compared with using the conductive pillars, only using the conductive vias makes it easier to adjust the size of the vertical connection structures according to the magnitude of the current. For example, when the current is larger, the large current may be transmitted by widening the conductive via.

Figure 3:
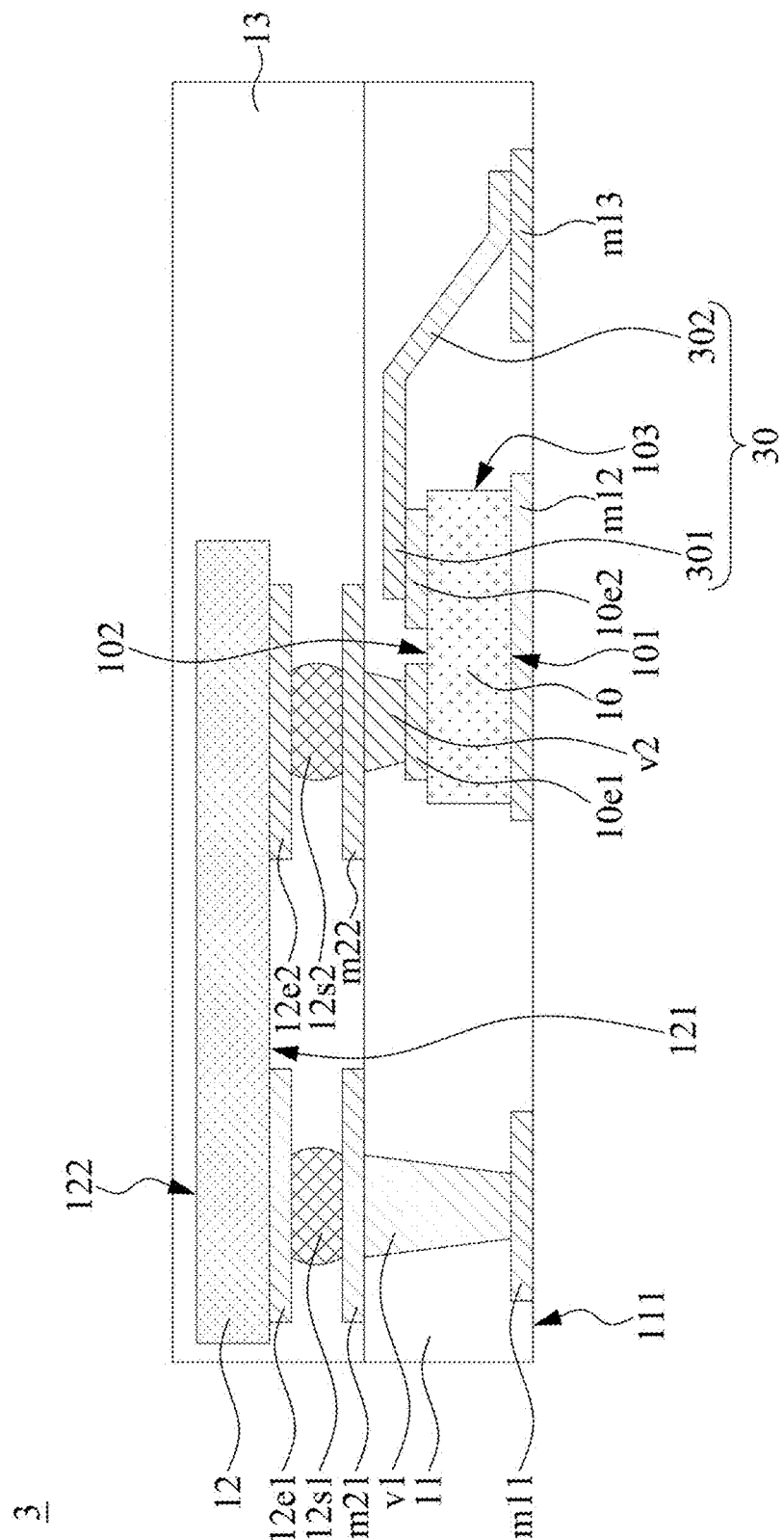
FIG. 3 shows a cross-sectional view of an electronic component package according to certain embodiments of the present application.

FIG. 3 shows a cross-sectional view of an electronic component package 3 according to certain embodiments of the present application. The electronic component package 3 shown in FIG. 3 is similar to the electronic component package 2 shown in FIG. 2, and the same or similar components are denoted with the same signs. A detailed description of the same or similar components will not be repeated, and the differences therebetween will be described below.

In the electronic component package 3, the conductive via v3, the metal layer portion m23 and the conductive via v4 are replaced with a monolithic conductor 30 to couple the source metal layer 10e2 to the external terminal m13. The monolithic conductor 30 may have one end overlapping the source metal layer 10e2 and extending toward the outside of the electronic component 10, such as extending beyond the surface 103. For example, the monolithic conductor 30 may have a portion 301 extending horizontally from the source metal layer 10e2. The horizontally extending portion 301 may have one end overlapping the source metal layer 10e2 and the other end not overlapping with the source metal layer 10e2. In addition, the monolithic conductor 30 may have another portion 302 coupling the horizontally extending portion 301 to the external terminal m13. The portion 302 may extend between one end of the portion 301 and the external terminal m13 in a non-perpendicular and non-horizontal manner. In some embodiments, the monolithic conductor 30 may be covered by the encapsulate 13.

In some embodiments, the process steps of the electronic component package 3 may be less than those of the electronic component package 2. Moreover, compared with coupling the source metal layer 10e2 to the external terminal m13 by using the conductive pillar or the conductive via, the current path of the electronic component package 3 may be shorter. In some embodiments, if a plurality of external terminals m13 (as shown in FIG. 1B) are included, the monolithic conductor 30 may couple the source (whether one or a plurality of sources) of the electronic component 10 to the plurality of external terminals m13.

With reference to FIGS. 4A to 4F, FIGS. 4A to 4F show one or more stages in a manufacturing method for an electronic component package according to certain embodiments of the present application. At least some of these figures have been simplified to facilitate a better understanding of aspects of the present disclosure.

Figure 4A:
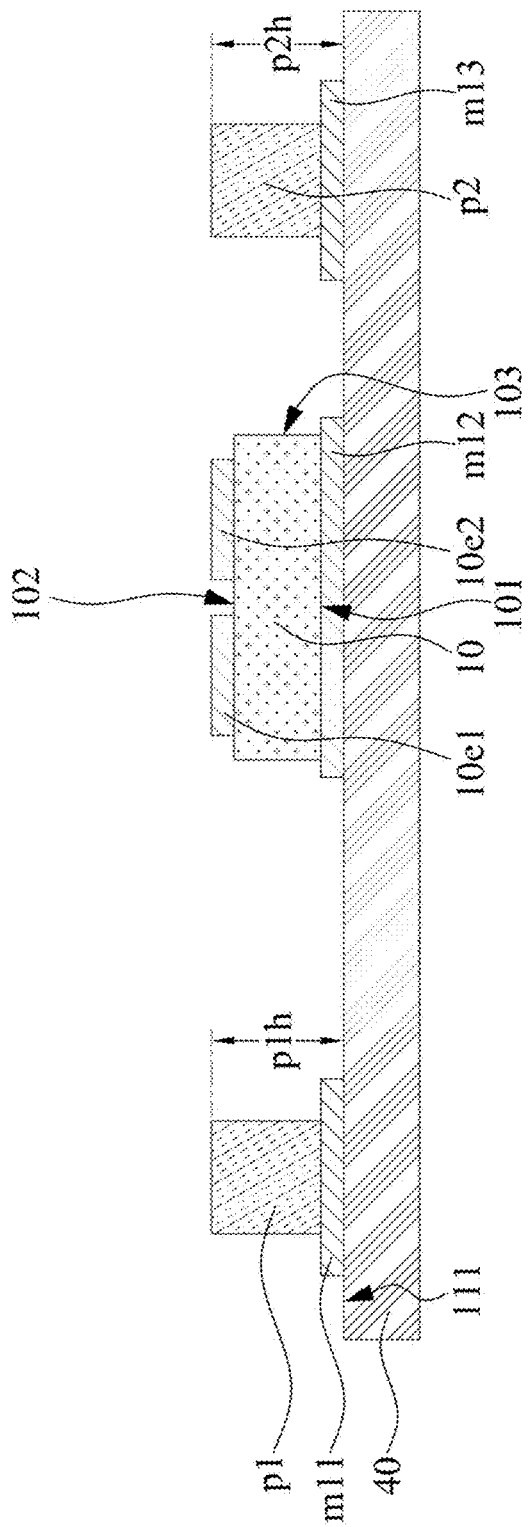
FIGS. 4A to 4F show one or more stages in a manufacturing method for an electronic component package according to certain embodiments of the present application.

With reference to FIG. 4A, the manufacturing method includes providing a temporary carrier 40. The temporary carrier 40 may include a substrate, such as a ceramic substrate, a semiconductor substrate, a dielectric substrate, a glass substrate, or the like. The temporary carrier 40 may be conductive, for example including a metal substrate or having a metal layer or a conductive layer thereon.

The manufacturing method includes disposing a first metal layer on the temporary carrier 40. The first metal layer may be formed by plating or chemical vapor deposition (CVD). The first metal layer may be patterned to form external terminals m11, m12, and m13.

Next, a conductive pillar p1, an electronic component 10, and a conductive pillar p2 are disposed on the external terminals m11, m12, and m13, respectively. A drain of the electronic component 10 may contact the external terminal m12 downward. A gate metal layer 10e1 of a gate and a source metal layer 10e2 of a source may be located at a surface 102. In some embodiments, the height p1h of the conductive pillar p1 and the height p2h of the conductive pillar p2 may be equal. In some embodiments, the top of the conductive pillar p1 may be coplanar with a surface of the gate metal layer 10e1 (or source metal layer 10e2). In some embodiments, the top of the conduction column p2 may be coplanar with a surface of the gate metal layer 10e1 (or source metal layer 10e2).

Figure 4B:
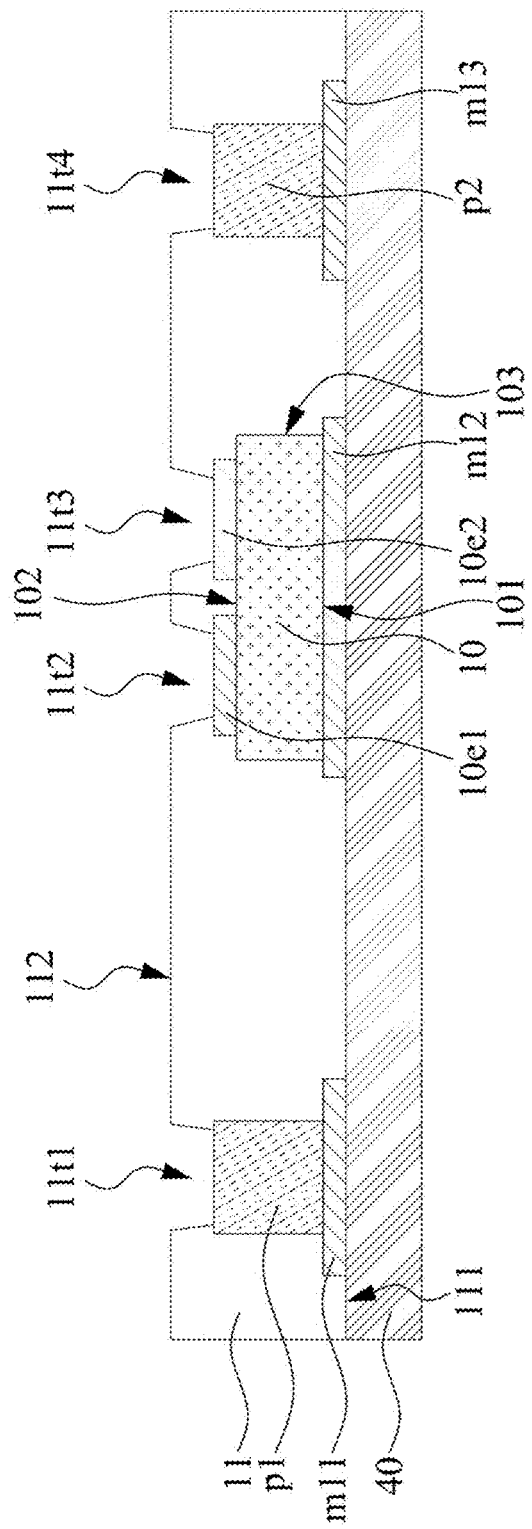

Referring to FIG. 4B, an encapsulate 11 is formed on the temporary carrier 40 to cover the conductive pillar p1, the electronic component 10, the conductive pillar p2, and at least a part of the first metal layer. In some embodiments, the encapsulate 11 is formed by a molding technique such as transfer molding or compression molding.

Next, a portion of encapsulate 11 may be removed to form openings 11t1, 11t2, 11t3, and 11t4. The openings 11t1, 11t2, 11t3, and 11t4 expose portions of the conductive pillar p1, the gate metal layer 10e1, the source metal layer 10e2, and the conductive pillar p2, respectively.

In some embodiments, the openings 11t1, 11t2, 11t3, and 11t4 may have upper and lower portions with different slopes. The upper portions may be wider than the lower portions. The upper portions may taper toward the lower portions. The upper portions may taper toward the temporary carrier 40. In some embodiments, the openings 11t1, 11t2, 11t3, and 11t4 may be formed by a laser drilling process.

Figure 4C:
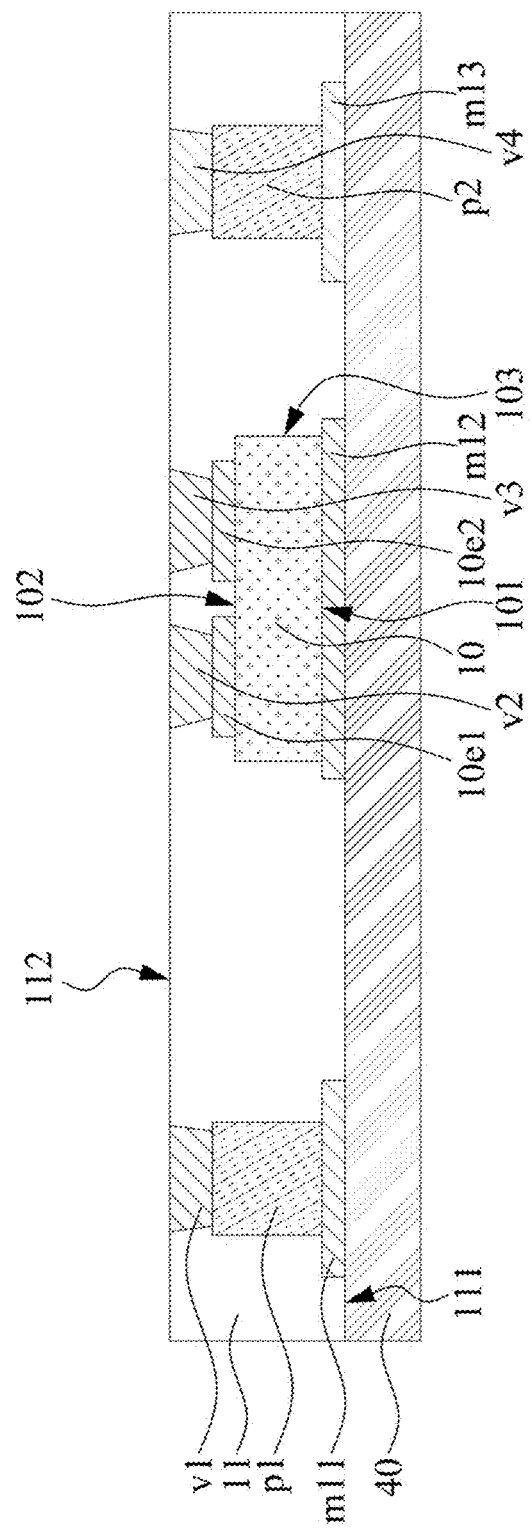

With reference to FIG. 4C, a conductive material may be formed in the openings 11t1, 11t2, 11t3, and 11t4 to form conductive vias v1, v2, v3, and v4. In some embodiments, the conductive material may be formed by physical vapor deposition (PVD), such as sputtering or spraying. In some embodiments, the conductive material may be formed by plating or CVD. In some embodiments, the tops of the conductive vias v1, v2, v3, and v4 may be made coplanar by a planarization process, an abrasive process, or another suitable removal process.

Figure 4D:
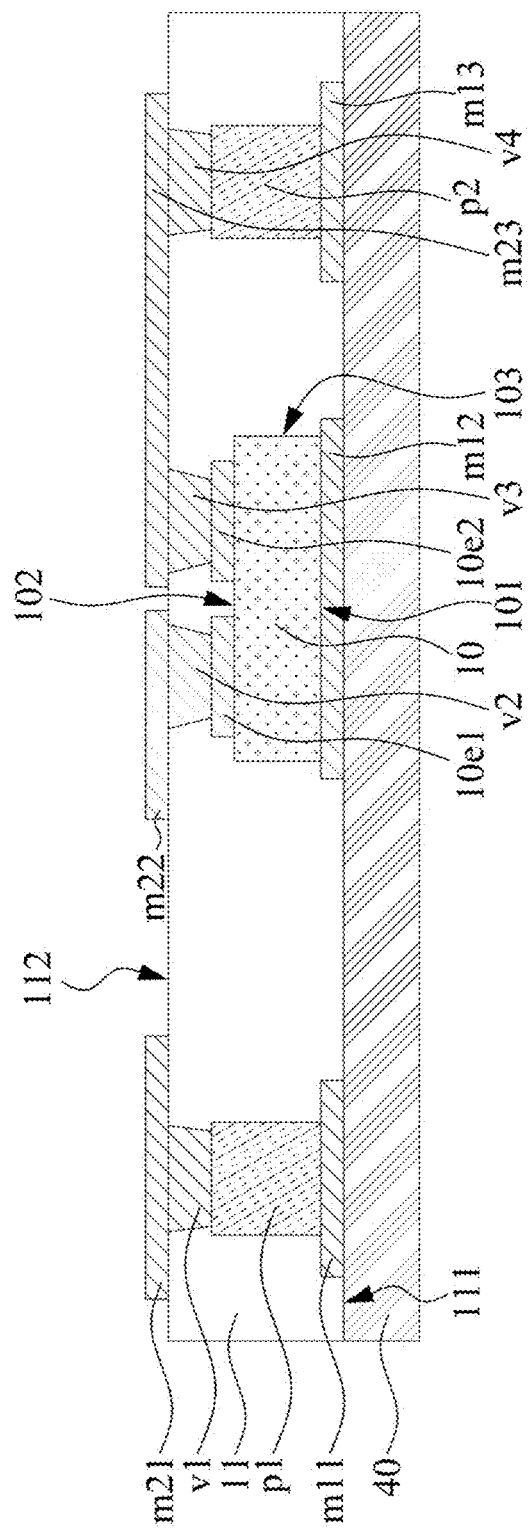

With reference to FIG. 4D, a second metal layer is disposed on the surface 112 of the encapsulate 11. The second metal layer may be formed by plating or CVD. The second metal layer may be patterned to form metal layer portions m21, m22, and m23.

Figure 4E:
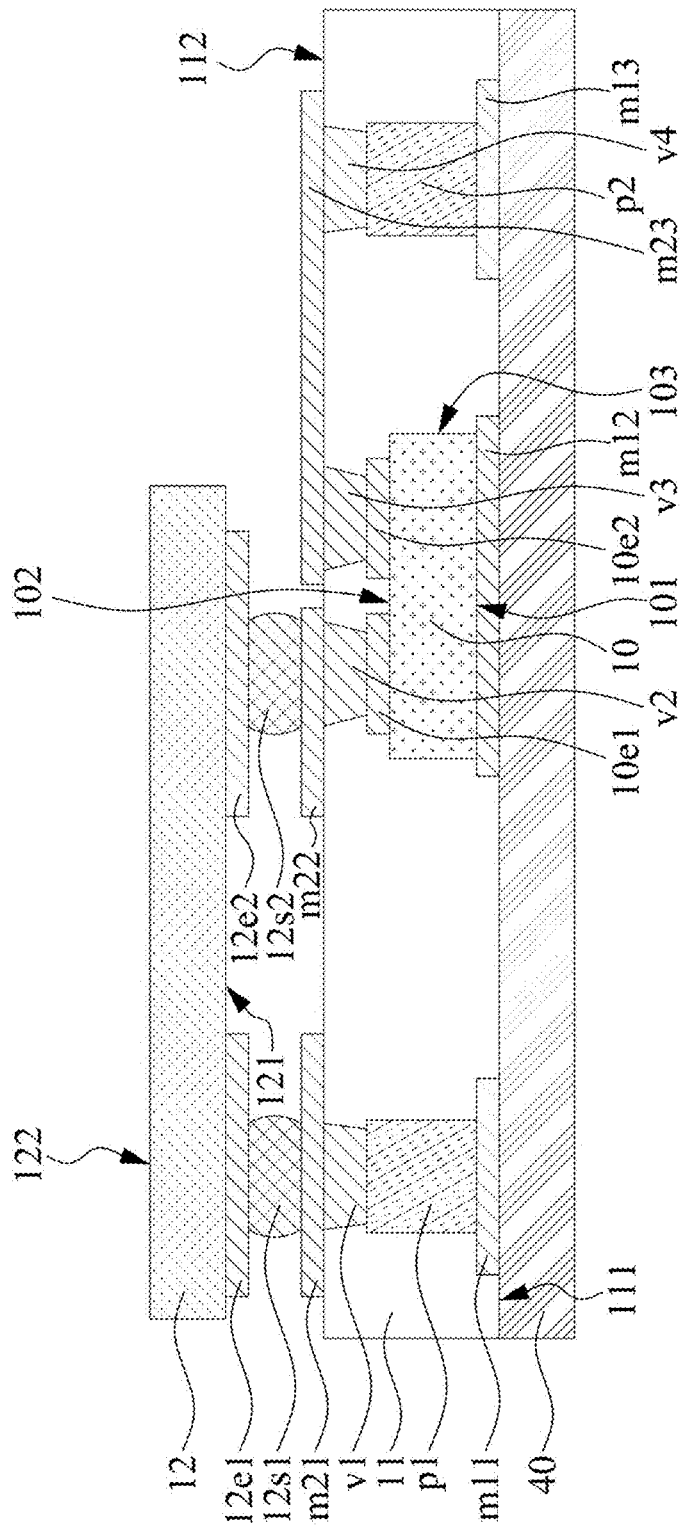

With reference to FIG. 4E, an electronic component 12 is disposed on the second metal layer. The metal layer 12e1 of the control terminal (or electrical terminal) may be coupled to the metal layer portion m21 of the second metal layer through an electrical connector 12s1. The metal layer 12e2 of the control terminal may be coupled to the metal layer portion m22 of the second metal layer through an electrical connector 12s2.

Figure 4F:
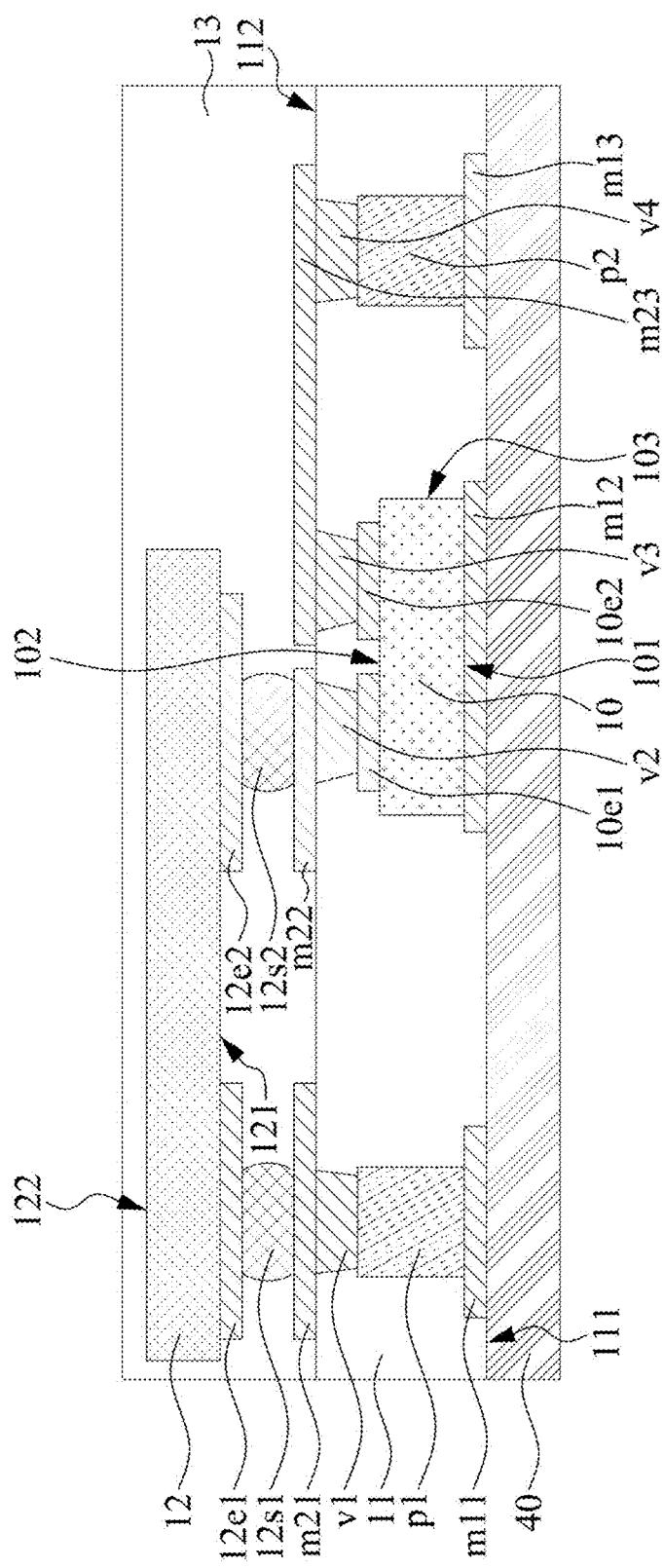

Referring to FIG. 4F, an encapsulate 13 is formed on the encapsulate 11 to cover the electronic component 12, the electrical connectors 12s1 and 12s2, and at least a part of the second metal layer. In some embodiments, the encapsulate 13 is formed by a molding technique, such as transfer molding or compression molding. Thereafter, the temporary carrier 40 is removed to expose the external terminals m11, m12, and m13.

The semiconductor structure formed by the above steps may be the same as the electronic component package 1 shown in FIG. 1A.

With reference to FIGS. 5A to 5F, FIGS. 5A to 5F show one or more stages in a manufacturing method for an electronic component package according to certain embodiments of the present application. At least some of these figures have been simplified to facilitate a better understanding of aspects of the present disclosure.

Figure 5A:
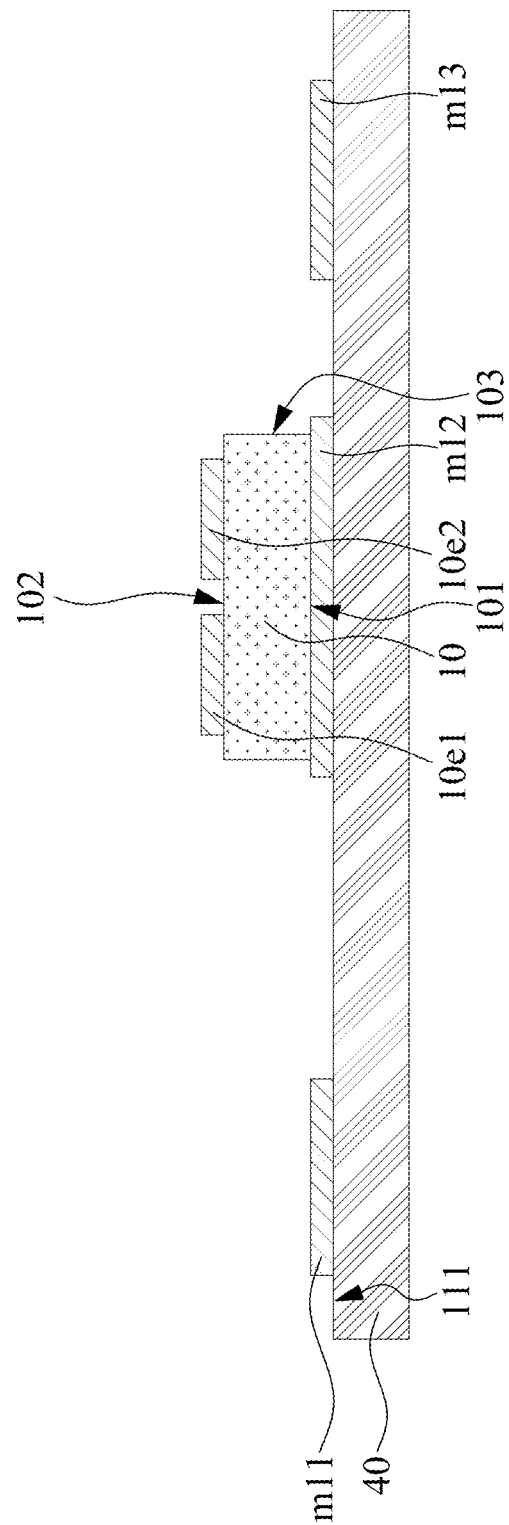
FIGS. 5A to 5F show one or more stages in a manufacturing method for an electronic component package according to certain embodiments of the present application.

With reference to FIG. 5A, the manufacturing method includes providing a temporary carrier 40. The temporary carrier 40 may include a substrate, such as a ceramic substrate, a semiconductor substrate, a dielectric substrate, a glass substrate, or the like. The temporary carrier 40 may be conductive, for example including a metal substrate or having a metal layer or a conductive layer thereon.

The manufacturing method includes disposing a first metal layer on the temporary carrier 40. The first metal layer may be formed by plating or CVD The first metal layer may be patterned to form external terminals m11, m12, and m13.

Next, the electronic component 10 is disposed on the external terminal m12. A drain of the electronic component 10 may contact the external terminal m12 downward. A gate metal layer 10e1 of a gate and a source metal layer 10e2 of a source may be located at a surface 102.

Figure 5B:
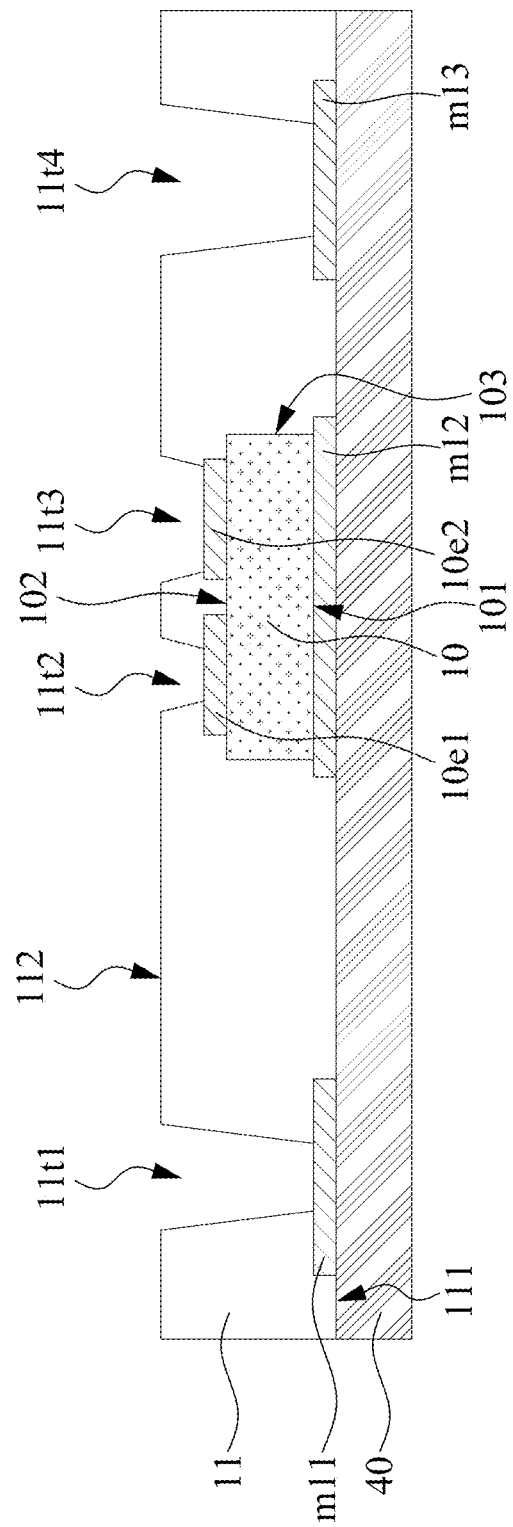

With reference to FIG. 5B, an encapsulate 11 is formed on the temporary carrier 40 to cover the electronic component 10 and at least a part of the first metal layer. In some embodiments, the encapsulate 11 is formed by a molding technique such as transfer molding or compression molding.

Next, a portion of encapsulate 11 may be removed to form openings 11t1, 11t2, 11t3, and 11t4. The openings 11t1, 11t2, 11t3, and 11t4 expose portions of the external terminal m11, the gate metal layer 10e1, the source metal layer 10e2, and the external terminal m13, respectively.

In some embodiments, the openings 11t1, 11t2, 11t3, and 11t4 may have upper and lower portions with different slopes. The upper portions may be wider than the lower portions. The upper portions may taper toward the lower portions. The upper portions may taper toward the temporary carrier 40. In some embodiments, the openings 11t1, 11t2, 11t3, and 11t4 may be formed by a laser drilling process.

Figure 5C:
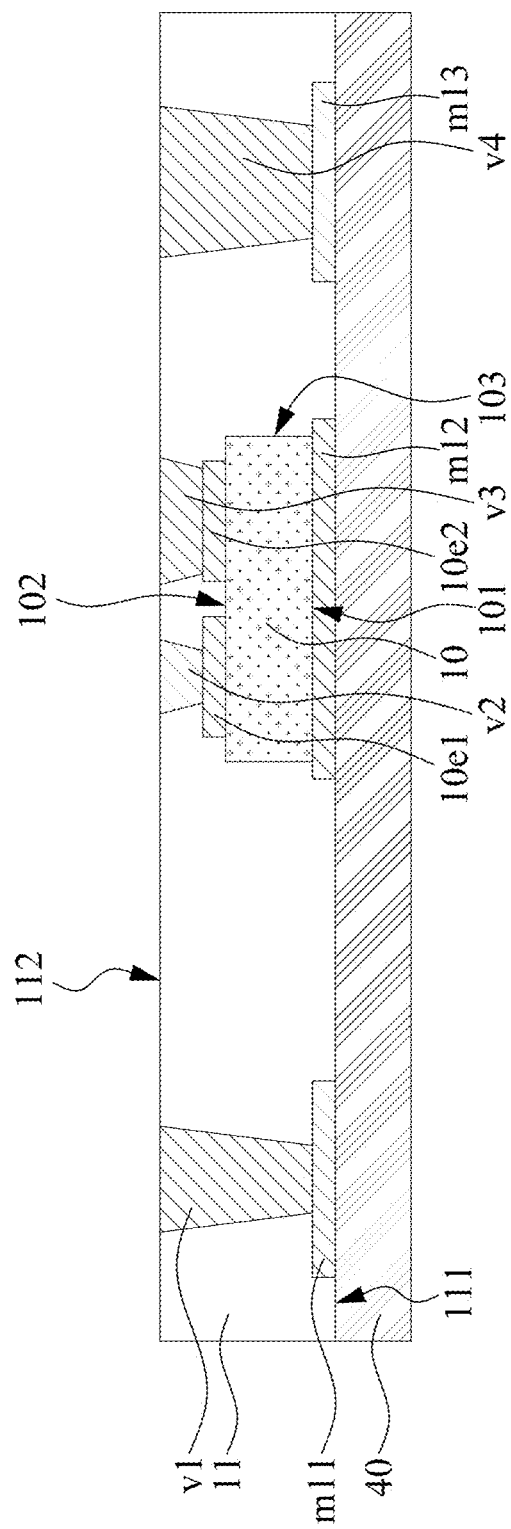

With reference to FIG. 5C, a conductive material may be formed in the openings 11t1, 11t2, 11t3, and 11t4 to form conductive vias v1, v2, v3, and v4. In some embodiments, the conductive material may be formed by PVD, such as sputtering or spraying. In some embodiments, the conductive material may be formed by plating or CVD. In some embodiments, the tops of the conductive vias v1, v2, v3, and v4 may be made coplanar by a planarization process, an abrasive process, or another suitable removal process.

Figure 5D:
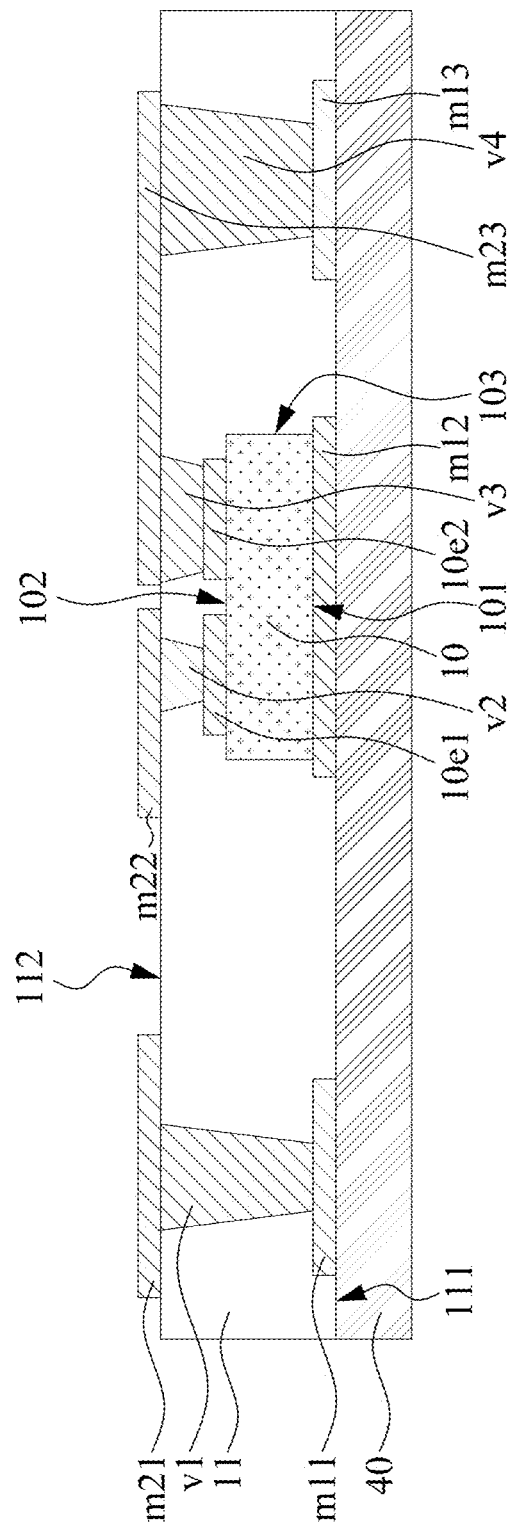
Figure 5E:
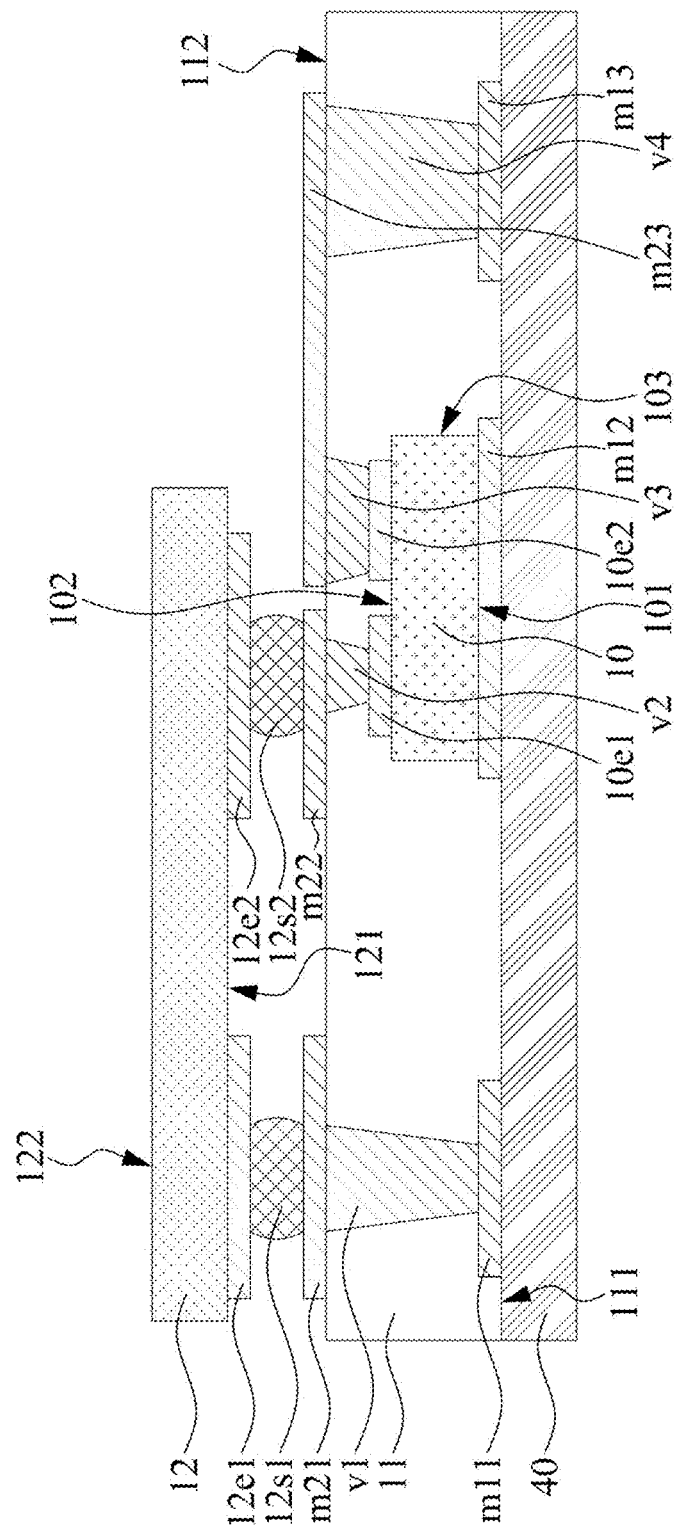
Figure 5F:
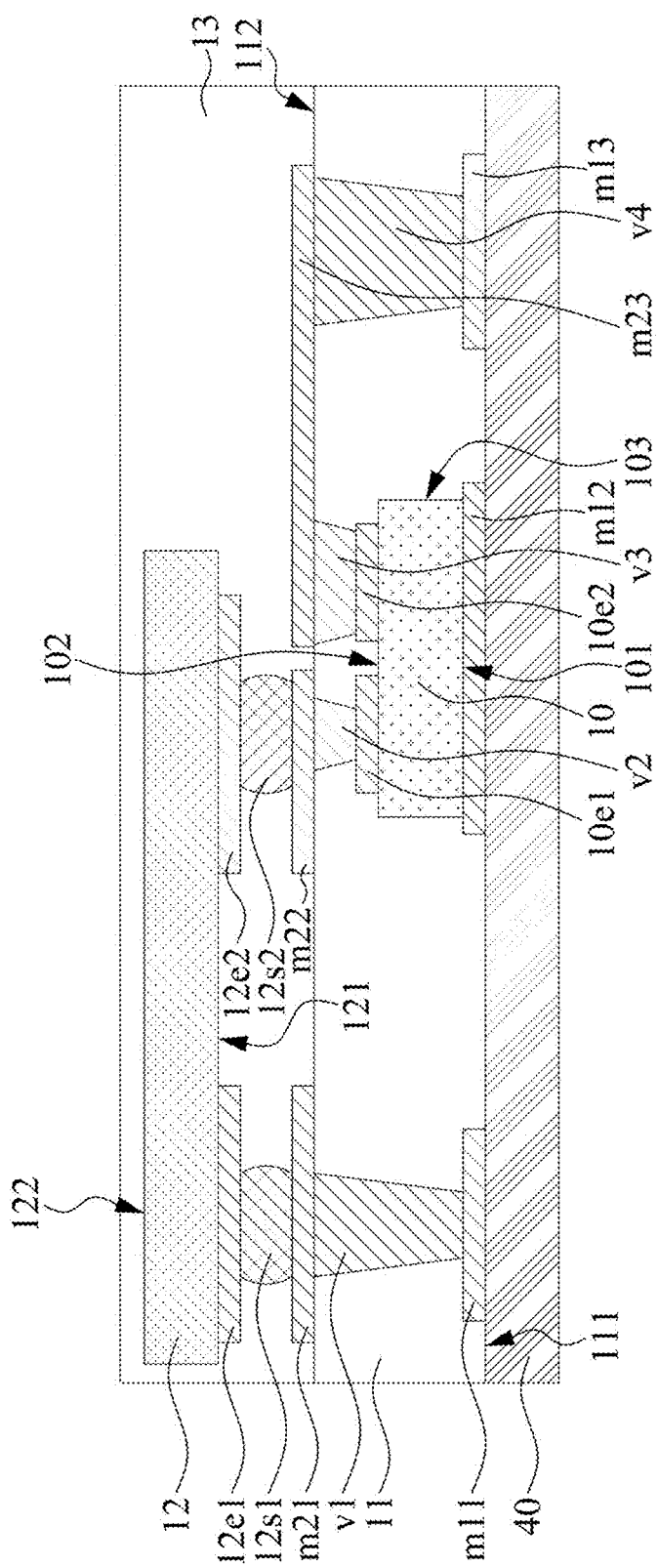

The steps of FIGS. 5D to 5F are the same as those of FIGS. 4D to 4F, and will not be repeated here. Thereafter, the temporary carrier 40 is removed to expose the external terminals m11, m12, and m13.

The semiconductor structure formed by the above steps may be the same as the electronic component package 2 shown in FIG. 2.

With reference to FIGS. 6A to 6F, FIGS. 6A to 6F show one or more stages in a manufacturing method for an electronic component package according to certain embodiments of the present application. At least some of these figures have been simplified to facilitate a better understanding of aspects of the present disclosure.

Figure 6A:
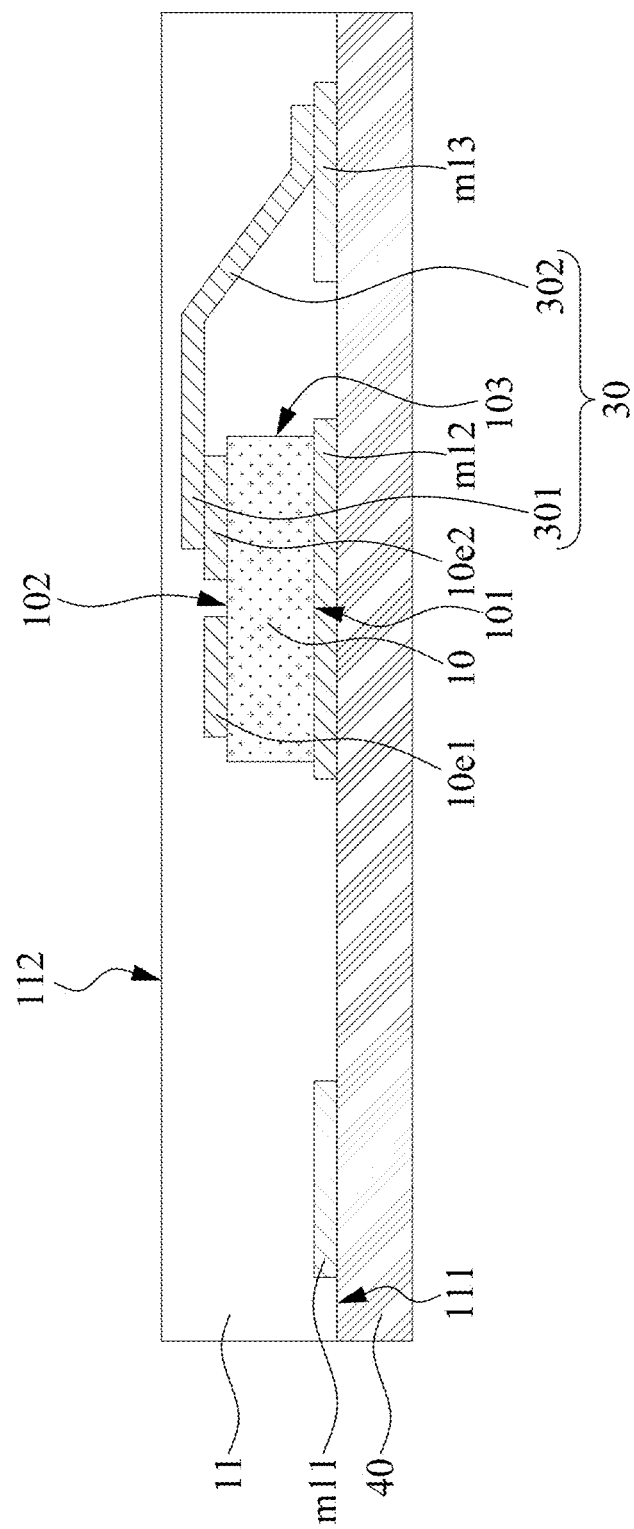
FIGS. 6A to 6F show one or more stages in a manufacturing method for an electronic component package according to certain embodiments of the present application.

With reference to FIG. 6A, the manufacturing method includes providing a temporary carrier 40. The temporary carrier 40 may include a substrate, such as a ceramic substrate, a semiconductor substrate, a dielectric substrate, a glass substrate, or the like. The temporary carrier 40 may be conductive, for example including a metal substrate or having a metal layer or a conductive layer thereon.

The manufacturing method includes disposing a first metal layer on the temporary carrier 40. The first metal layer may be formed by plating or CVD The first metal layer may be patterned to form external terminals m11, m12, and m13. An electronic component 10 is disposed on the external terminal m12. A drain of the electronic component 10 may contact the external terminal m12 downward. A gate metal layer 10e1 of a gate and a source metal layer 10e2 of a source may be located at a surface 102.

Next, the source metal layer 10e2 is coupled to the external terminal m13 through a monolithic conductor 30.

Next, an encapsulate 11 is formed on the temporary carrier 40 to cover the electronic component 10, the monolithic conductor 30, and at least a part of the first metal layer.

Figure 6B:
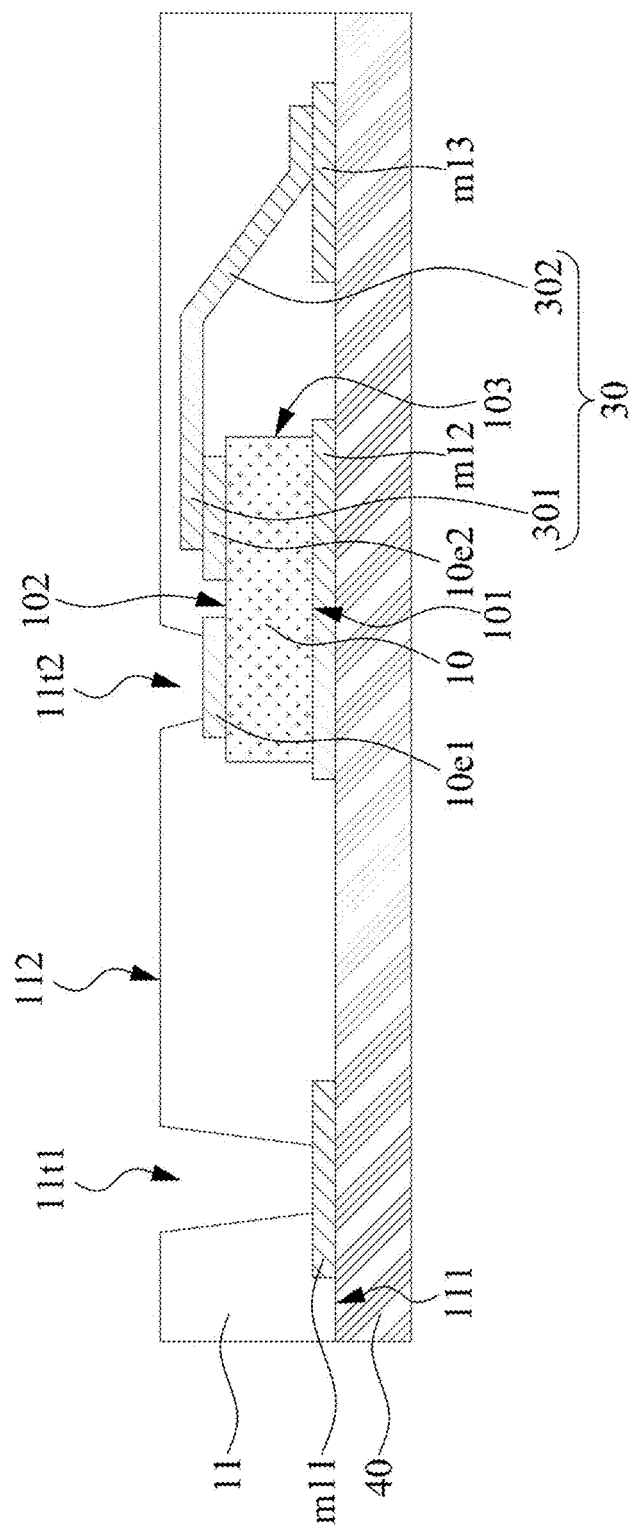

With reference to FIG. 6B, a portion of encapsulate 11 may be removed to form openings 11t1 and 11t2. The openings 11t1 and 11t2 expose portions of the external terminal m11 and the gate metal layer 10e1, respectively.

In some embodiments, the openings 11t1 and 11t2 may have upper and lower portions with different slopes. The upper portions may be wider than the lower portions. The upper portions may taper toward the lower portions. The upper portions may taper toward the temporary carrier 40. In some embodiments, the openings 11t1 and 11t2 may be formed by a laser drilling process.

Figure 6C:
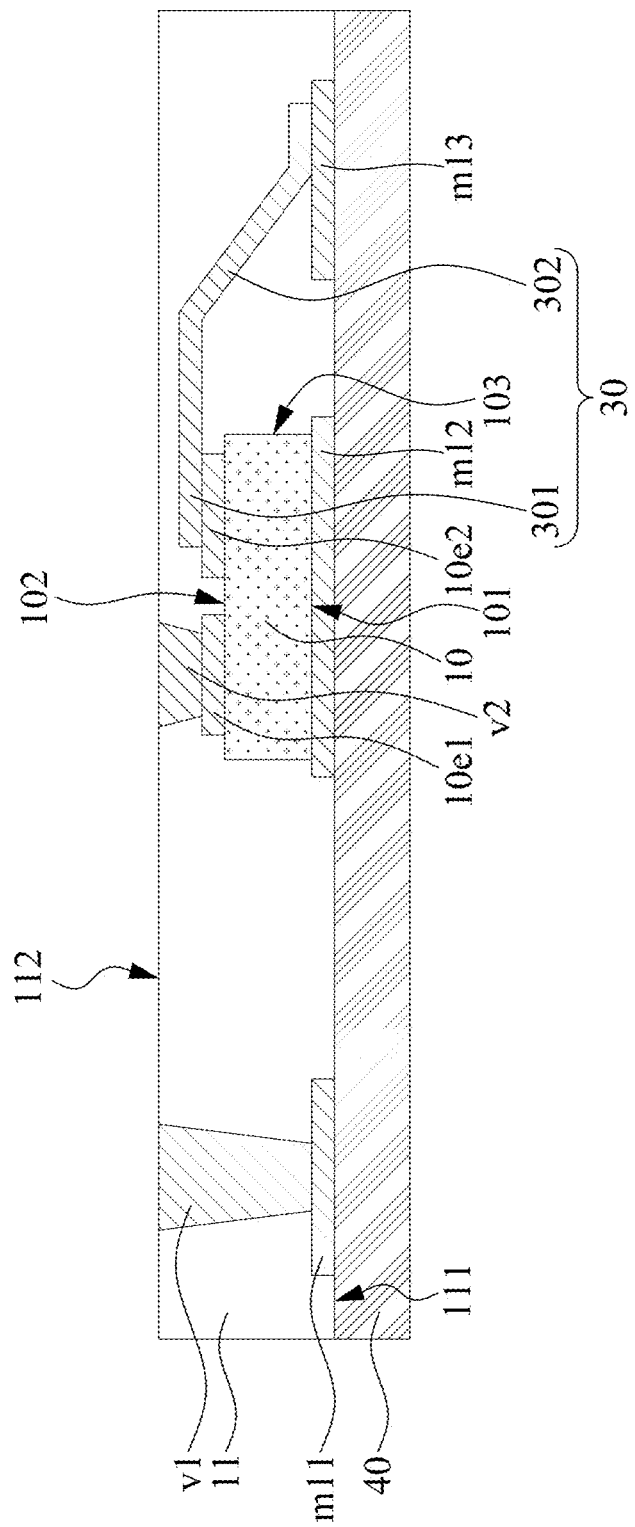

With reference to FIG. 6C, a conductive material may be formed in the openings 11t1 and 11t2 to form conductive vias v1 and v2. In some embodiments, the conductive material may be formed by PVD, such as sputtering or spraying. In some embodiments, the conductive material may be formed by plating or CVD. In some embodiments, the tops of the conductive vias v1 and v2 may be made coplanar by a planarization process, an abrasive process, or another suitable removal process.

Figure 6D:
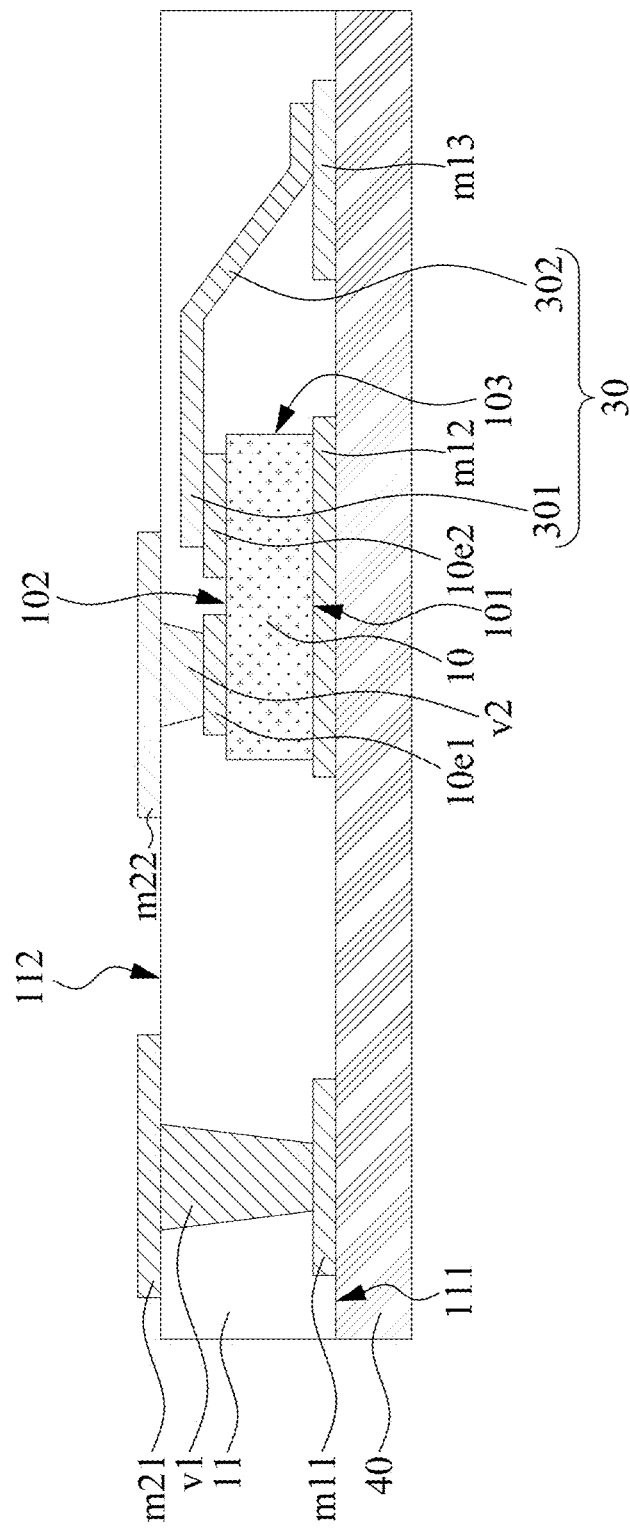
Figure 6E:
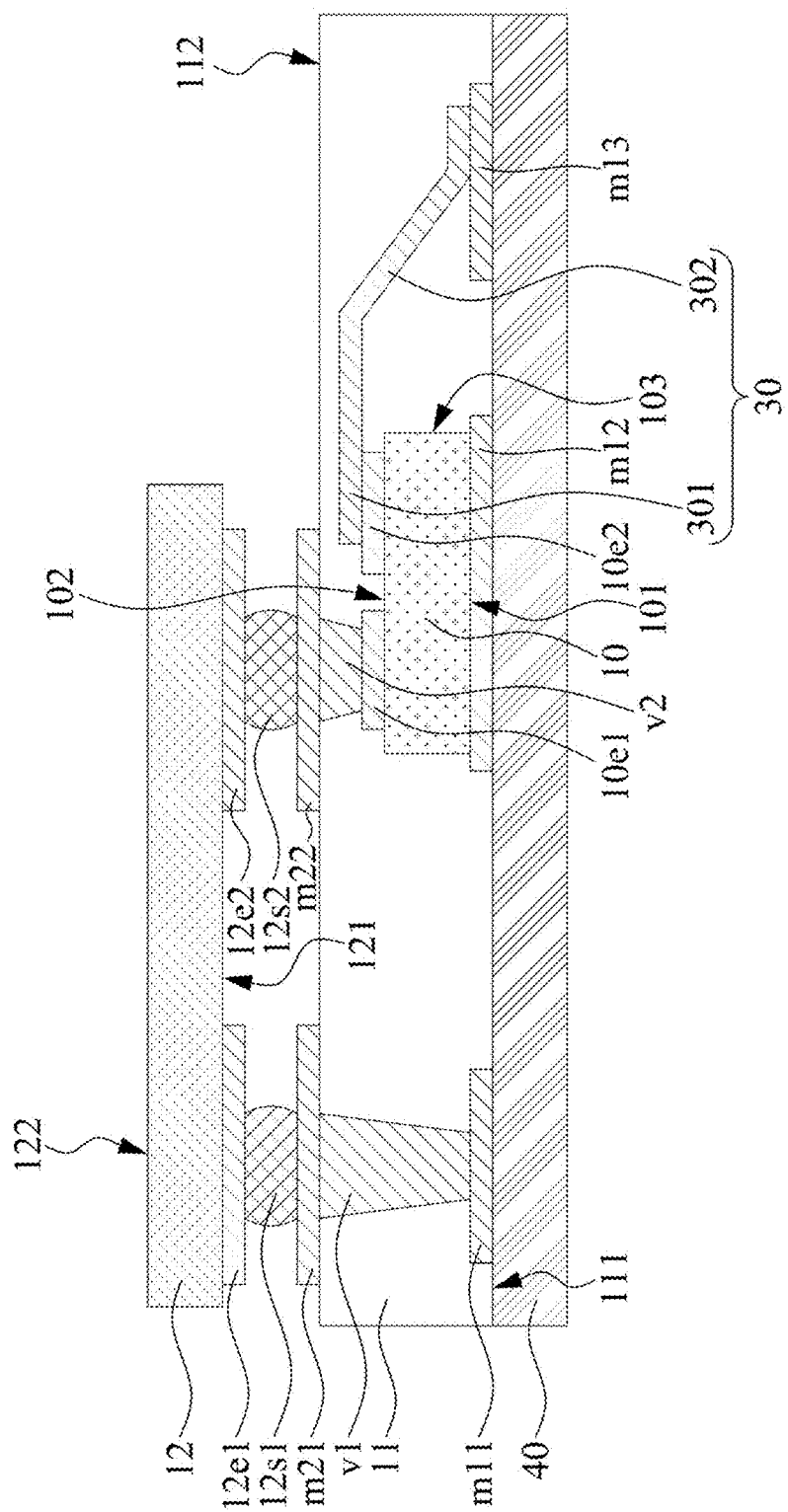
Figure 6F:
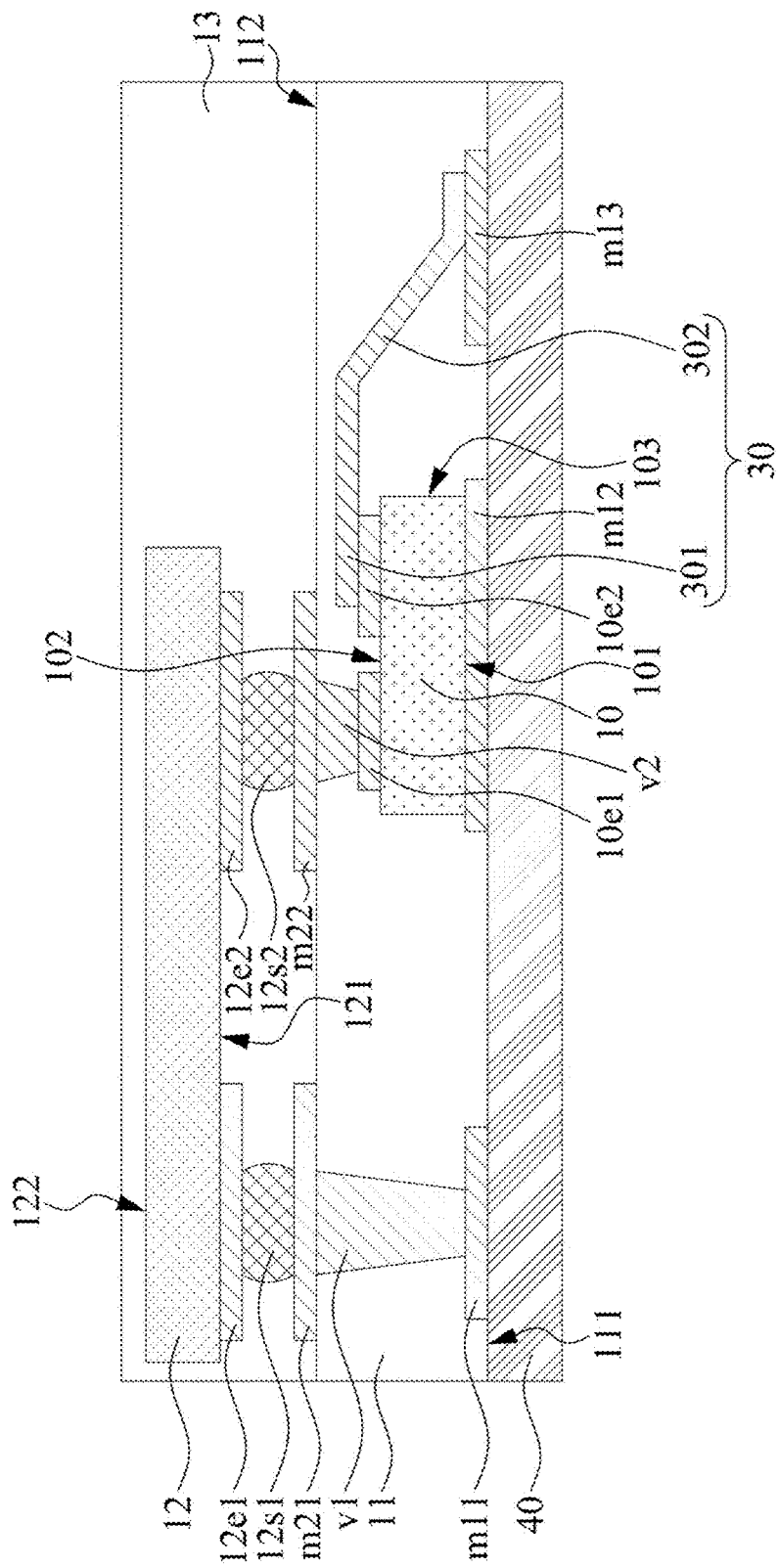

The steps of FIGS. 6D to 6F are the same as those of FIGS. 6D to 6F, and will not be repeated here. Thereafter, the temporary carrier 40 is removed to expose the external terminals m11, m12, and m13.

The semiconductor structure formed by the above steps may be the same as the electronic component package 3 shown in FIG. 3.

Herein, for convenience of description, spatially relative terms such as "below," "under," "lower," "above," "upper," "left side," and "right side" may be used to describe the relationship between one component or feature and another or more components or features as shown in the accompanying drawings. In addition to the orientation depicted in the accompanying drawings, the spatially relative terms may be intended to encompass different orientations of a device in use or operation. The device may be otherwise oriented (by rotating 90 degrees or at other orientations) and accordingly, spatially relative descriptors used herein may likewise be interpreted. It should be understood that when a component is referred to as "connected to" or "coupled to" another component, it may be directly connected to or coupled to another component, or an intermediate component may be present.

As used herein, the terms "approximately," "substantially," "essentially," and "about" are used to describe and interpret small variations. When used in conjunction with an event or circumstance, the terms can refer to instances where the event or circumstance occurs exactly as well as instances where the event or circumstance occurs nearly. As used herein with respect to a given value or range, the term "about" refers generally to within ±10%, ±5%, ±1%, or ±0.5% of a given value or range. The range may be expressed herein as one endpoint to another endpoint or between two endpoints. All ranges disclosed herein include endpoints unless otherwise specified. The term "substantially coplanar" may refer to the difference in position of two surfaces located along the same plane being within several microns (μm), such as a position difference located along the same plane being within 10 μm, 5 μm, 1 μm or 0.5 μm. When values or properties are referred to as being "substantially" identical, the term may refer to values that are within ±10%, ±5%, ±1%, or ±0.5% of the mean value of the stated values.

The foregoing summarizes the features of several embodiments and the detailed aspects of the present disclosure. The embodiments described in the present disclosure may be readily used as a basis for designing or modifying other processes and structures to facilitate implementation of the same or similar purpose and/or achieve the same or similar advantages of the embodiments introduced herein. Such equivalents are not departing from the spirit and scope of the present disclosure, and various changes, replacements and alterations may be made without departing from the spirit and scope of the present disclosure.

What is claimed is:

1. An electronic component package comprising:
a first metal layer comprising a first external terminal, a second external terminal, and a third external terminal that are not in direct contact with each other;
a high-voltage transistor semiconductor die having a gate, a source, and a drain, wherein the drain is located on a first side of the high-voltage transistor semiconductor die, the gate and the source is located on a second side of the high-voltage transistor semiconductor die, the first side and the second side of the high-voltage transistor semiconductor die being opposite to each other, the high-voltage transistor semiconductor die is disposed on the first metal layer, and the drain is coupled to the second external terminal;
a first molding compound layer having a first side and a second side that are opposite to each other, the first molding compound layer covering the high-voltage transistor semiconductor die, the first molding compound layer further covering at least a portion of the first metal layer, wherein the first external terminal, the second external terminal, and the third external terminal are exposed from the first side of the first molding layer;
a second metal layer comprising a first metal layer portion and a second metal layer portion that are not in direct contact with each other, wherein the second metal layer is disposed on the second side of the first molding compound layer;
a first vertical connection structure passing through the first molding compound layer and coupling the first metal layer portion to the first external terminal;
a second vertical connection structure passing through a portion of the first molding compound layer and coupling the second metal layer portion to the gate of the high-voltage transistor semiconductor die;
a control circuit bare chip having an active surface facing the gate and the source of the high-voltage transistor semiconductor die, the active surface comprising a first control terminal and a second control terminal that are correspondingly coupled to the first metal layer portion and the second metal layer portion; and
a second molding compound layer having a first side and a second side that are opposite to each other, wherein the second molding compound layer is disposed on the first molding compound layer, and the first side of the second molding compound layer is attached to the second side of the first molding compound layer, so that the second molding compound layer covers the control circuit bare chip and the second metal layer;

wherein the first control terminal of the control circuit bare chip is coupled to the first external terminal through the first metal layer portion and the first vertical connection structure;

wherein the second control terminal of the control circuit bare chip is coupled to the gate of the high-voltage transistor semiconductor die through the second metal layer portion and the second vertical connection structure; and wherein the source of the high-voltage transistor semiconductor die is coupled to the third external terminal.

2. The electronic component package of claim 1, wherein the first vertical connection structure comprises a first conductive via, and the second vertical connection structure comprises a second conductive via, and wherein the first conductive via comprises a first side and a second side, the second conductive via comprises a first side and a second side, a diameter of the first conductive via is reduced from the second side of the first conductive via to the first side of the first conductive via, and a diameter of the second conductive via is reduced from the second side of the second conductive via to the first side of the second conductive via.

3. The electronic component package of claim 2, wherein the second conductive via extends from the second side of the first molding compound layer to the first side of the first molding compound layer, the second side of the second conductive via is coplanar with the second side of the first molding compound layer, and the first side of the second conductive via contacts a gate metal layer of the gate of the high-voltage transistor semiconductor die.

4. The electronic component package of claim 2, wherein the first conductive via extends from the second side of the first molding compound layer to the first side of the first molding compound layer, the second side of the first conductive via is coplanar with the second side of the first molding compound layer, and the first side of the first conductive via is not coplanar with the first side of the first molding compound layer.

5. The electronic component package of claim 2, wherein the first vertical connection structure further comprises a first conductive pillar disposed between the first conductive via and the first external terminal, the first conductive pillar comprises a first side and a second side, and a diameter of the first conductive pillar remains unchanged from the second side of the first conductive pillar to the first side of the first conductive pillar, and wherein the first side of the first conductive via contacts the second side of the first conductive pillar and the first conductive pillar extends from the first side of the first conductive via to the first side of the first molding compound layer, so that the first side of the first conductive pillar contacts the first external terminal.

6. The electronic component package of claim 1, wherein the second metal layer further comprises a third metal layer portion that does not directly contact the first metal layer portion and the second metal layer portion, and wherein the second metal layer portion is located between the first metal layer portion and the third metal layer portion.

7. The electronic component package of claim 6, further comprising:

a third vertical connection structure passing through a portion of the first molding compound layer and coupling the third metal layer portion to the source of the high-voltage transistor semiconductor die; and a fourth vertical connection structure passing through the first molding compound layer and coupling the third metal layer portion to the third external terminal, so that the source of the high-voltage transistor semiconductor die is coupled to the third external terminal.

8. The electronic component package of claim 7, wherein the third vertical connection structure comprises a third conductive via, and the fourth vertical connection structure comprises a fourth conductive via, and wherein the third conductive via comprises a first side and a second side, the fourth conductive via comprises a first side and a second side, a diameter of the third conductive via is reduced from the second side of the third conductive via to the first side of the third conductive via, and a diameter of the fourth conductive via is reduced from the second side of the fourth conductive via to the first side of the fourth conductive via.

9. The electronic component package of claim 8, wherein the third conductive via extends from the second side of the first molding compound layer to the first side of the first molding compound layer, the second side of the third conductive via is coplanar with the second side of the first molding compound layer, and the first side of the third conductive via contacts a source metal layer of the source of the high-voltage transistor semiconductor die.

10. The electronic component package of claim 8, wherein the fourth conductive via extends from the second side of the first molding compound layer to the first side of the first molding compound layer, the second side of the fourth conductive via is coplanar with the second side of the first molding compound layer, and the first side of the fourth conductive via is not coplanar with the first side of the first molding compound layer.

11. The electronic component package of claim 8, wherein the fourth vertical connection structure further comprises a second conductive pillar disposed between the fourth conductive via and the third external terminal, the second conductive pillar comprises a first side and a second side, and a diameter of the second conductive pillar remains unchanged from the second side of the second conductive pillar to the first side of the second conductive pillar, and wherein the first side of the fourth conductive via contacts the second side of the second conductive pillar, and the second conductive pillar extends from the first side of the fourth conductive via to the first side of the first molding compound layer, so that the first side of the second conductive pillar contacts the third external terminal.

12. The electronic component package of claim 1, further comprising:

a monolithic conductor comprising:

a first portion disposed on a source metal layer of the source of the high-voltage transistor semiconductor die, wherein when viewed from a top view, the first portion of the monolithic conductor extends from the source metal layer of the source to an outside of the high-voltage transistor semiconductor die, so that a first end of the first portion of the monolithic conductor overlaps the high-voltage transistor semiconductor die, and a second end of the first portion of the monolithic conductor does not overlap the high-voltage transistor semiconductor die; and a second portion coupled to the second end of the first portion of the monolithic conductor and the third external terminal in a non-perpendicular and non-horizontal 20 manner.

13. A manufacturing method for an electronic component package, the method comprising:

providing a temporary carrier;

forming a first metal layer on the temporary carrier, the first metal layer comprising a first external terminal, a second external terminal, and a third external terminal that are not in direct contact with each other;

disposing a high-voltage transistor semiconductor die on the first metal layer, wherein the high-voltage transistor semiconductor die has a gate, a source, and a drain, and wherein the drain is located on a first side of the high-voltage transistor semiconductor die and coupled to the second external terminal, and the gate and the source are located on a second side of the high-voltage transistor semiconductor die, the first side and the second side of the high-voltage transistor semiconductor die being opposite to each other;

forming a first molding compound layer on the temporary carrier to cover the high-voltage transistor semiconductor die and at least a portion of the first metal layer, wherein the first molding compound layer has a first side and a second side that are opposite to each other;

forming a second metal layer on the second side of the first molding compound layer, the second metal layer comprising a first metal layer portion and a second metal layer portion that are not in direct contact with each other;

coupling the first metal layer portion to the first external terminal;

coupling the second metal layer portion to the gate of the high-voltage transistor semiconductor die;

disposing a control circuit bare chip on the first molding compound, the control circuit bare chip having an active surface facing the gate and the source of the high-voltage transistor semiconductor die, the active surface comprising a first control terminal and a second control terminal that are correspondingly coupled to the first metal layer portion and the second metal layer portion;

forming a second molding compound layer on the first molding compound layer, the second molding compound layer having a first side and a second side that are opposite to each other, and the first side of the second molding compound layer being attached to the second side of the first molding compound layer to cover the control circuit bare chip and the second metal layer;

coupling the source of the high-voltage transistor semiconductor die to the third external terminal; and removing the temporary carrier to expose the first external terminal, the second external terminal, and the third external terminal from the first side of the first molding compound layer.

14. The manufacturing method of claim 13, further comprising:

disposing a first conductive pillar on the first external terminal, the first conductive pillar comprising a first side and a second side, the first side of the first conductive pillar contacting the first external terminal, and a diameter of the first conductive pillar remaining unchanged from the second side of the first conductive pillar to the first side of the first conductive pillar;

disposing a second conductive pillar on the third external terminal, the second conductive pillar comprising a first side and a second side, the first side of the second conductive pillar contacting the third external terminal, and a diameter of the second conductive pillar remaining unchanged from the second side of the second conductive pillar to the first side of the second conductive pillar;

forming the first molding compound layer on the temporary carrier to cover the first conductive pillar and the second conductive pillar; and forming a plurality of openings in the first molding compound layer to expose a portion of the first conductive pillar, a portion of the second conductive pillar, a portion of a gate metal layer of the gate, and a portion of a source metal layer of the source.

15. The manufacturing method of claim 14, further comprising:

forming a first conductive via on the first conductive pillar, the first conductive via comprising a first side and a second side, the first side of the first conductive via contacting the second side of the first conductive pillar, and a diameter of the first conductive via being reduced from the second side of the first conductive via to the first side of the first conductive via;

forming a second conductive via on the gate metal layer, the second conductive via comprising a first side and a second side, the first side of the second conductive via contacting the gate metal layer, and a diameter of the second conductive via being reduced from the second side of the second conductive via to the first side of the second conductive via;

forming a third conductive via on the source metal layer, the third conductive via comprising a first side and a second side, the first side of the third conductive via contacting the source metal layer, and a diameter of the third conductive via being reduced from the second side of the third conductive via to the first side of the third conductive via;

forming a fourth conductive via on the second conductive pillar, the fourth conductive via comprising a first side and a second side, the first side of the fourth conductive via contacting the second side of the second conductive pillar, and a diameter of the fourth conductive via being reduced from the second side of the fourth conductive via to the first side of the fourth conductive via; and forming a third metal layer portion on the first molding compound layer, the third metal layer portion being not in direct contact with the first metal layer portion and the second metal layer portion, wherein the second metal layer portion is located between the first metal layer portion and the third metal layer portion, and wherein the third metal layer portion is coupled to the third conductive via and the fourth conductive via so that the source of the high-voltage transistor semiconductor die is coupled to the third external terminal.

16. The manufacturing method of claim 15, wherein the second side of the first conductive via, the second side of the second conductive via, the second side of the third conductive via, the second side of the fourth conductive via, and the second side of the first molding compound layer are coplanar.

17. The manufacturing method of claim 15, wherein the first side of the first conductive via, the first side of the second conductive via, the first side of the third conductive via, the first side of the fourth conductive via, and the first side of the first molding compound layer are not coplanar.

18. The manufacturing method of claim 15, wherein the first side of the first conductive via, the first side of the second conductive via, the first side of the third conductive via, and the first side of the fourth conductive via are coplanar.

19. The manufacturing method of claim 13, further comprising:
- forming the first molding compound layer on the temporary carrier to cover the first external terminal and the third external terminal;
- forming a plurality of openings in the first molding compound layer to expose a portion of the first external terminal, a portion of the third external terminal, a portion of a gate metal layer of the gate, and a portion of a source metal layer of the source;
- forming a first conductive via on the first external terminal, the first conductive via comprising a first side and a second side, the first side of the first conductive via contacting the first external terminal, and a diameter of the first conductive via being reduced from the second side of the first conductive via to the first side of the first conductive via;
- forming a second conductive via on the gate metal layer, the second conductive via comprising a first side and a second side, the first side of the second conductive via contacting the gate metal layer, and a diameter of the second conductive via being reduced from the second side of the second conductive via to the first side of the second conductive via;
- forming a third conductive via on the source metal layer, the third conductive via comprising a first side and a second side, the first side of the third conductive via contacting the source metal layer, and a diameter of the third conductive via being reduced from the second side of the third conductive via to the first side of the third conductive via;
- forming a fourth conductive via on the third external terminal, the fourth conductive via comprising a first side and a second side, the first side of the fourth conductive via contacting the third external terminal, and a diameter of the fourth conductive via being reduced from the second side of the fourth conductive via to the first side of the fourth conductive via; and
- forming a third metal layer portion on the first molding compound layer, the third metal layer portion being not in direct contact with the first metal layer portion and the second metal layer portion, wherein the second metal layer portion is located between the first metal layer portion and the third metal layer portion, and wherein the third metal layer portion is coupled to the third conductive via and the fourth conductive via so that the source of the high-voltage transistor semiconductor die is coupled to the third external terminal.

20. The manufacturing method of claim 13, further comprising:
- forming a monolithic conductor having:
  - a first portion disposed on a source metal layer of the source of the high-voltage transistor semiconductor die, wherein when viewed from a top view, the first portion of the monolithic conductor extends from the source metal layer of the source to an outside of the high-voltage transistor semiconductor die, so that a first end of the first portion of the monolithic conductor overlaps the high-voltage transistor semiconductor die, and a second end of the first portion of the monolithic conductor does not overlap the high-voltage transistor semiconductor die; and
  - a second portion coupled to the second end of the first portion of the monolithic conductor and the third external terminal in a non-perpendicular and non-horizontal manner;
- forming the first molding compound layer on the temporary carrier to cover the monolithic conductor and a portion of the source metal layer;
- forming a plurality of openings in the first molding compound layer to expose a portion of the first external terminal and a portion of a gate metal layer of the gate;
- forming a first conductive via on the first external terminal, the first conductive via comprising a first side and a second side, the first side of the first conductive via contacting the first external terminal, and a diameter of the first conductive via being reduced from the second side of the first conductive via to the first side of the first conductive via; and
- forming a second conductive via on the gate metal layer, the second conductive via comprising a first side and a second side, the first side of the second conductive via contacting the gate metal layer, and a diameter of the second conductive via being reduced from the second side of the second conductive via to the first side of the second conductive via.

* * * * *